United States Patent
Tatsumura et al.

(10) Patent No.: US 7,968,956 B2
(45) Date of Patent: Jun. 28, 2011

(54) SEMICONDUCTOR DEVICE

(75) Inventors: Kosuke Tatsumura, Kawasaki (JP); Masakazu Goto, Yokohama (JP); Reika Ichihara, Yokohama (JP); Masato Koyama, Miura-gun (JP); Shigeru Kawanaka, Yokohama (JP); Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/388,965

(22) Filed: Feb. 19, 2009

(65) Prior Publication Data
US 2009/0267159 A1 Oct. 29, 2009

(30) Foreign Application Priority Data
Apr. 25, 2008 (JP) ................... 2008-116204

(51) Int. Cl.
*H01L 29/78* (2006.01)
*H01L 21/70* (2006.01)
(52) U.S. Cl. . 257/412; 257/369; 257/754; 257/E27.064; 257/E21.192; 257/E21.195; 257/E29.16; 257/E29.162; 438/199; 438/216; 438/287; 438/591
(58) Field of Classification Search .................. None
See application file for complete search history.

(56) References Cited

U.S. PATENT DOCUMENTS

| | | | | |
|---|---|---|---|---|
| 7,303,983 B2* | 12/2007 | Triyoso et al. | ................ | 438/592 |
| 7,432,570 B2* | 10/2008 | Koyama et al. | ................ | 257/412 |
| 7,541,657 B2* | 6/2009 | Koyama et al. | ................ | 257/407 |
| 7,608,896 B2* | 10/2009 | Ichihara et al. | ................ | 257/369 |
| 7,612,413 B2* | 11/2009 | Koyama et al. | ................ | 257/369 |
| 7,632,728 B2* | 12/2009 | Koyama et al. | ................ | 438/198 |
| 7,728,394 B2* | 6/2010 | Koyama et al. | ................ | 257/412 |
| 7,745,888 B2* | 6/2010 | Koyama et al. | ................ | 257/407 |
| 2007/0145488 A1 | 6/2007 | Koyama et al. | | |
| 2008/0164581 A1* | 7/2008 | Cho et al. | ................ | 257/632 |

FOREIGN PATENT DOCUMENTS

| | | |
|---|---|---|
| JP | 2007-149755 | 6/2007 |
| JP | 2007-165414 | 6/2007 |

OTHER PUBLICATIONS

Van der Heyden et al. Workfunction (WF) simulations of Ta/HfO2, Ta2C/HfO2 and Ta2C/La2O3/HfO2 capped high-k stacks. Oct. 7-12, 2007. 212th ECS Meeting.*

(Continued)

*Primary Examiner* — Hoang-Quan T Ho
(74) *Attorney, Agent, or Firm* — Oblon, Spivak, McClelland, Maier & Neustadt, L.L.P.

(57) ABSTRACT

A semiconductor device includes a semiconductor substrate, a p-channel MIS transistor formed on the substrate, the p-channel transistor having a first gate dielectric formed on the substrate and a first gate electrode layer formed on the first dielectric, and an n-channel MIS transistor formed on the substrate, the n-channel transistor having a second gate dielectric formed on the substrate and a second gate electrode layer formed on the second dielectric. A bottom layer of the first gate electrode layer in contact with the first gate dielectric and a bottom layer of the second gate electrode layer in contact with the second gate dielectric have the same orientation and the same composition including Ta and C, and a mole ratio of Ta to a total of C and Ta, (Ta/(Ta+C)), is larger than 0.5.

8 Claims, 18 Drawing Sheets

OTHER PUBLICATIONS

Chang et al. Electrical Properties of Low-VT Metal-Gated n-MOSFETs Using La2O3/SiOx as Interfacial Layer Between HfLaO High-K Dielectrics and Si Channel. May 2008. IEEE Electron Device Letters. vol. 29, No. 5. pp. 430-433.*

Kubicek et al. Low VT CMOS using doped Hf-based oxides, TaC-based Metals and Laser-only Anneal. Dec. 10-12, 2007. Electron Devices Meeting, 2007. pp. 49-52.*

Shamuilia et al. Internal photoemission of electrons from Ta-based conductors into SiO2 and HfO2 insulators. 2008. Journal of Applied Physics. 104, 073722.*

O'Sullivan et al. Reliability study of La2O3 capped HfSiON high-permittivity n-type metal-oxide-semiconductor field-effect transistor devices with tantalum-rich electrodes. 2008. Journal of Applied Physics. 104, 044512.*

* cited by examiner

| Specimen number | Gate dielectric | Ta$_x$C$_{1-x}$ electrode layer Composition/thickness | TiN electrode layer | Poly Si electrode layer |
|---|---|---|---|---|
| #1 | HfSiON | Ta-rich layer/10nm | TiN layer/10nm (Heat-resistant barrier layer) | Poly Si layer |
| #2 | Hf/(Hf+Si)=0.5 | Ta-rich layer/5nm | | |
| #3 | [N]Concentration : 20at.% | Ta-rich layer/3nm | | |
| #4 | Interfacial layer similar to SiO$_2$ exists at interface between Si substrate and gate dielectric | Stacked layer of Ta-rich layer and C-rich layer | | |
| #5 | | C-rich layer/10nm | | |

F I G. 3

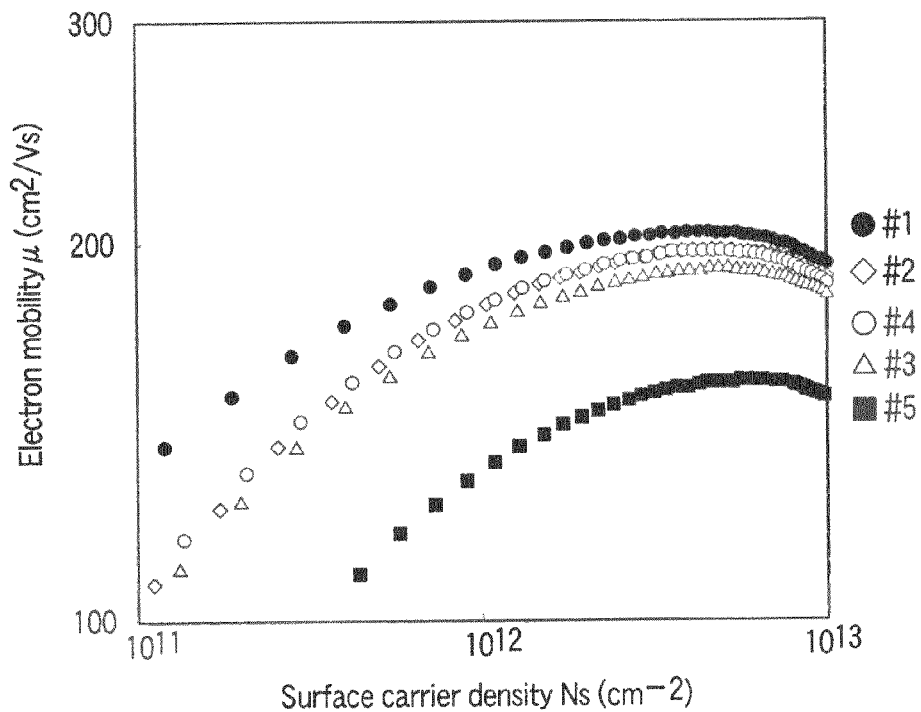
F I G. 6
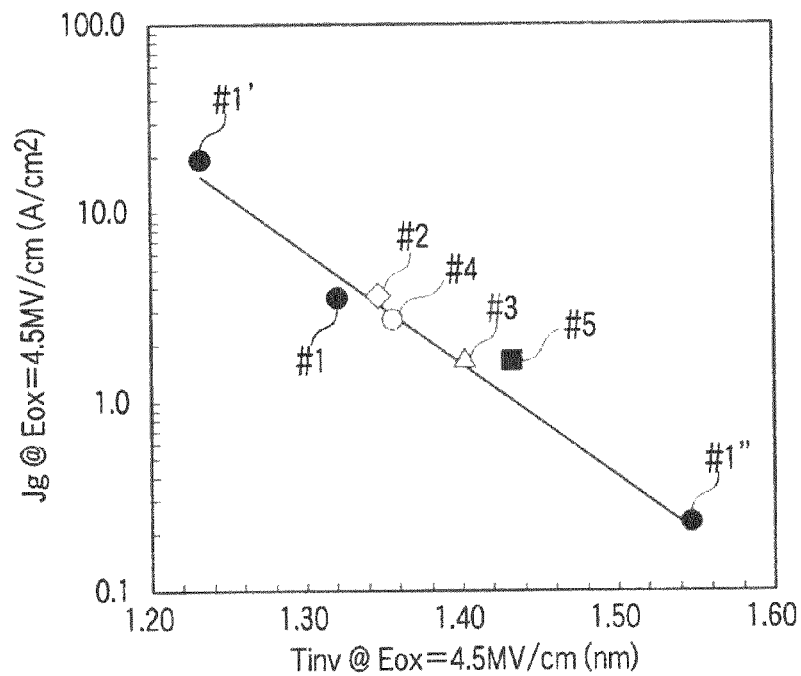
F I G. 7

After heat treatment at 1000°C

| | TaC(200) Orientation | TaC(111) Orientation |
|---|---|---|
| Very C-rich x=0.27 (TaC2.7) | 34% | 66% |
| C-rich x=0.43 (TaC1.3) | 38% | 62% |
| Ta-rich x=0.59 (TaC0.7) | 93% | 7% |

|  | as-depo. | |
|---|---|---|
|  | TaC(200) Orientation | TaC(111) Orientation |
| Very C-rich x=0.27 (TaC2.7) | 29% | 71% |
| C-rich x=0.43 (TaC1.3) | 36% | 64% |
| Ta-rich x=0.59 (TaC0.7) | 88% | 12% |

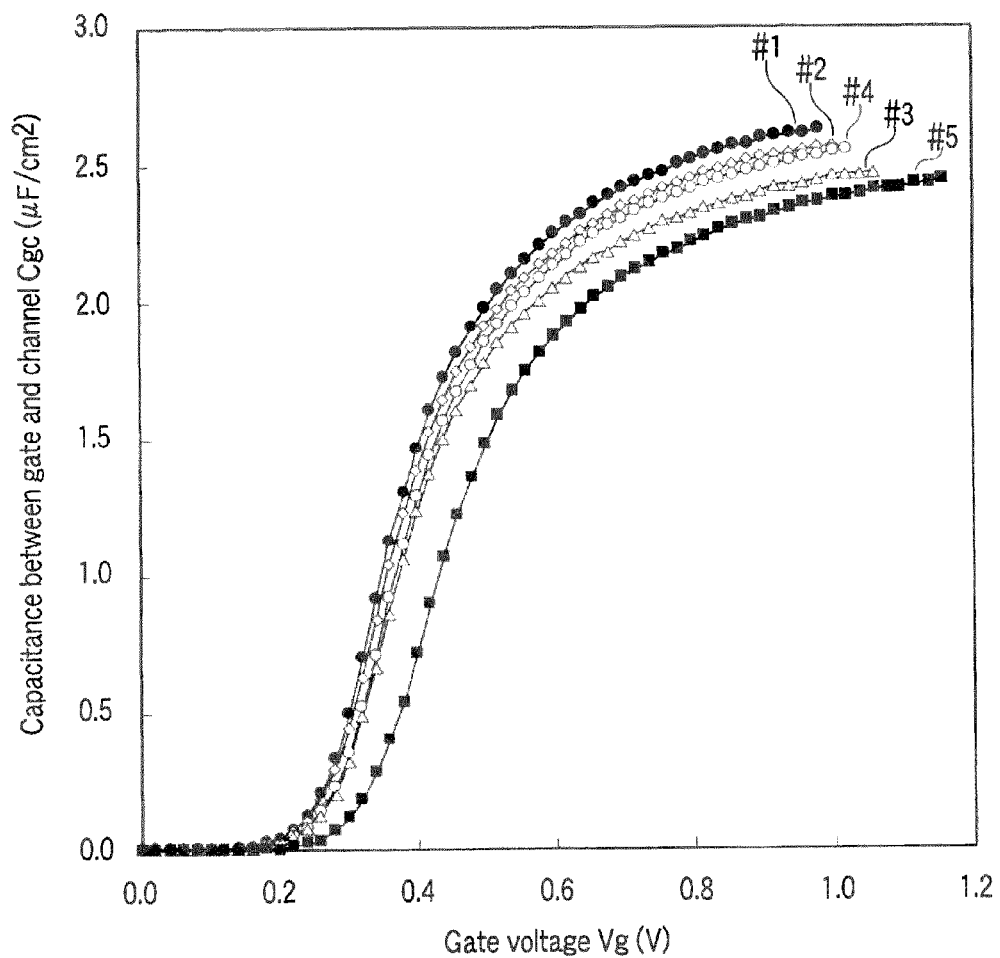
F I G. 14

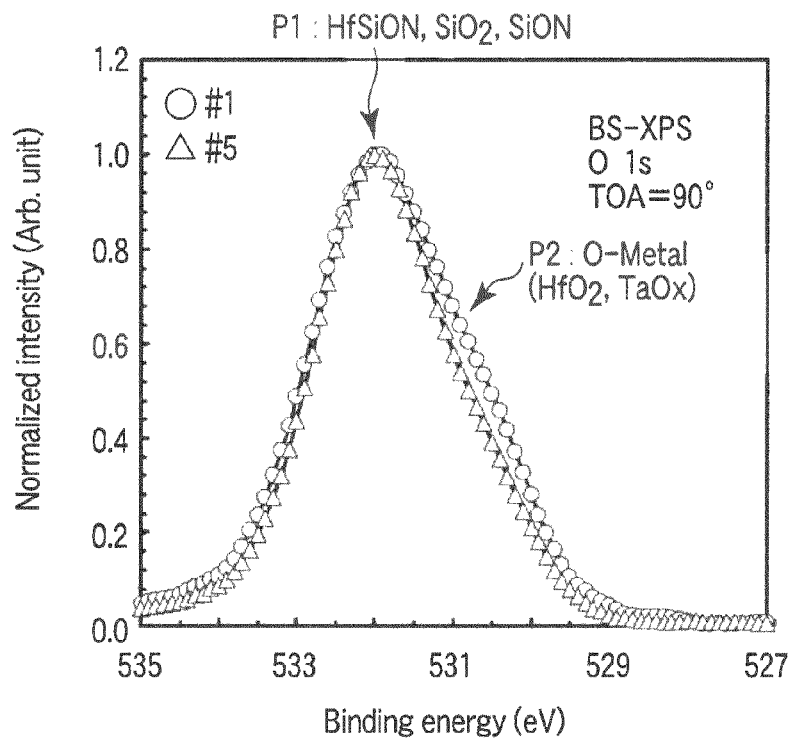
F I G. 20A
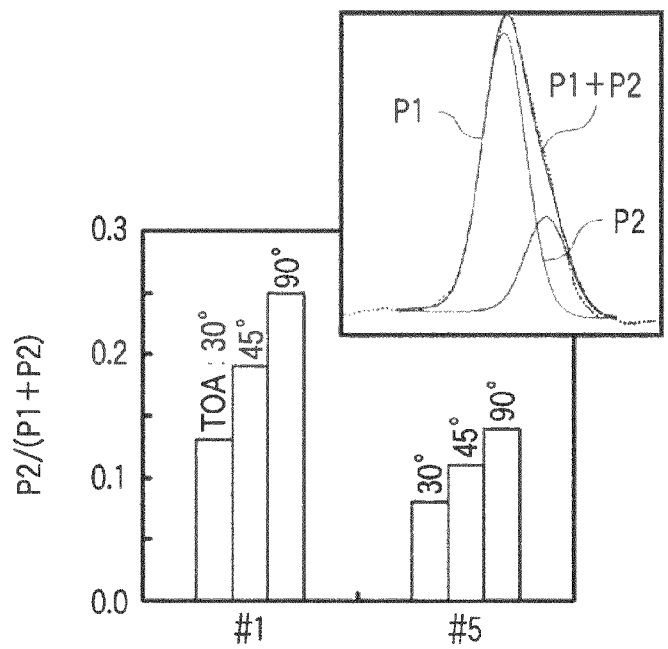
F I G. 20B

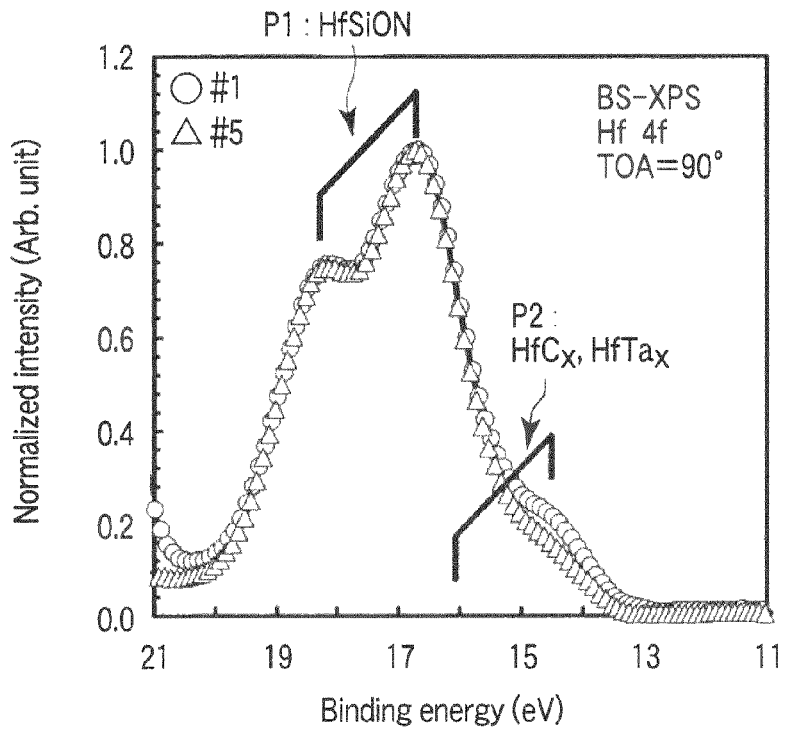
F I G. 21A
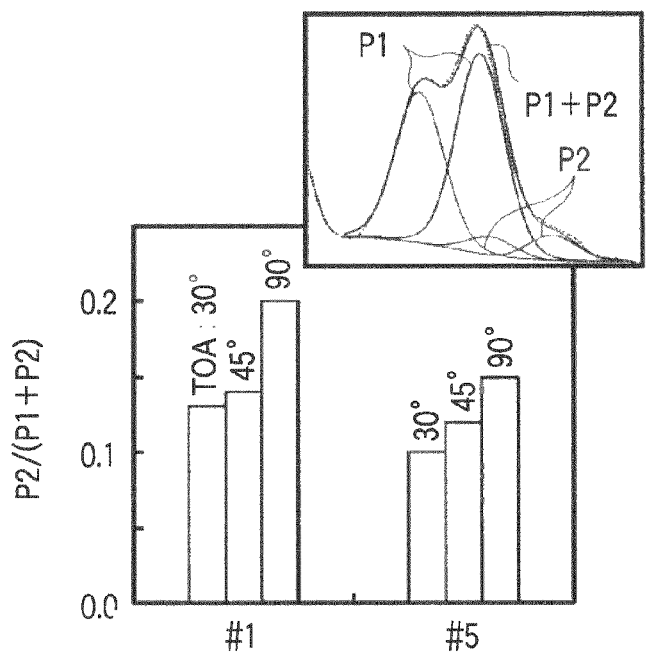
F I G. 21B

SEMICONDUCTOR DEVICE

CROSS-REFERENCE TO RELATED APPLICATIONS

This application is based upon and claims the benefit of priority from prior Japanese Patent Application No. 2008-116204, filed Apr. 25, 2008, the entire contents of which are incorporated herein by reference.

BACKGROUND

1. Technical Field

Exemplary embodiments described herein relate to a complementary MIS semiconductor device whose gate electrode structure is improved.

2. Description of the Related Art

In recent years, in silicon complementary metal-insulator-semiconductor (CMIS) semiconductor devices, use of a high-melting-point metal such as titanium, molybdenum, tungsten and tantalum, or a nitride thereof as a gate electrode has been attempted, which is referred to as the metal gate technique.

With the metal gate technique, since a depletion layer is not generated in a gate electrode in principle, current drive performance of an MIS transistor is not reduced by the depletion layer, unlike conventional polysilicon gates. Particularly, in a so-called single metal gate technique where both gate electrodes of an n-channel MIS transistor and a p-channel MIS transistor consist of a single metal gate material, deposition and patterning of the gate electrodes can be performed at the same time for the n-channel MIS transistor and the p-channel MIS transistor. As a result, problems such as complication and an increase in process steps, which arise when using different metal gates for the n-channel MIS transistor and the p-channel MIS transistor, can be solved.

An example of the single metal gate technique is a technique such that both gate electrodes of the n-channel and p-channel MIS transistors are formed by an alloy of Ta and C, and a composition of the TaC alloy is controlled so that a mole ratio of Ta to a total of Ta and C, (Ta/(Ta+C)), becomes ⅓ or less to ⅕ or more (see JP-A 2007-149755 (KOKAI)). A $Ta_xC_{1-x}$ electrode having the composition in this range is stable even at the time of a heat treatment at 1000° C., and shows a work function within a range of 4.5 to 4.7 eV.

On the other hand, in a dual metal gate technique using the alloy including Ta and C, such a technique that realizes the dual work functions suitable for the p-channel and n-channel MIS transistors by optimizing a crystal orientation ratio of TaC (111) faces, is known (see JP-A 2007-165414 (KOKAI)). In this technique, the crystal orientation ratio of the TaC (111) face of the p-channel MIS transistor is set to 80% or more, and the crystal orientation ratio of the TaC (111) face of the n-channel MIS transistor is set to 60% or less. A ratio of C to Ta, C/Ta, is defined within a range of 0.5 or more to 1.5 or less.

In such MIS transistors having a metal gate electrode, however, a reduction of inversion layer carrier mobility due to the metal gate electrode frequently becomes a problem. For this reason, a metal gate technique which maintains high mobility is required, but a method for realizing this is not known.

In order to improve the current drive performance of transistors and realize silicon CMIS (or CMOS) devices with high processing speed, it is indispensable to introduce the metal gate technique instead of the conventional polysilicon gate. However, a single metal gate structure which represses the reduction in the inversion layer carrier mobility to the minimum is not currently realized.

For this reason, it has been desired that semiconductor devices, which have a single metal gate structure suitable for silicon CMIS devices or the like and particularly can maintain high inversion layer carrier mobility, can be realized.

SUMMARY

According to a first aspect of the present disclosure, there is provided a semiconductor device, which includes:
a semiconductor substrate;
a p-channel MIS transistor formed on the semiconductor substrate, the p-channel MIS transistor having a first gate dielectric formed on the semiconductor substrate and a first gate electrode layer formed on the first gate dielectric; and
an n-channel MIS transistor formed on the semiconductor substrate, the n-channel MIS transistor having a second gate dielectric formed on the semiconductor substrate and a second gate electrode layer formed on the second gate dielectric,
wherein a bottom layer of the first gate electrode layer in contact with the first gate dielectric and a bottom layer of the second gate electrode layer in contact with the second gate dielectric have the same orientation and the same composition including Ta and C, and a mole ratio of Ta to a total of C and Ta, (Ta/(Ta+C)), is larger than 0.5.

According to a second aspect of the present disclosure, there is provided a semiconductor device, which includes:
a semiconductor substrate;
a p-channel MIS transistor formed on the semiconductor substrate, the p-channel MIS transistor having a first gate dielectric formed on the semiconductor substrate, a first gate electrode layer formed on the first gate dielectric and including Ta and C, and a first polysilicon layer formed on the first gate electrode layer; and
an n-channel MIS transistor formed on the semiconductor substrate, the n-channel MIS transistor having a second gate dielectric formed on the semiconductor substrate, a second gate electrode layer formed on the second gate dielectric and having the same composition and orientation as those of the first gate electrode, and a second polysilicon layer formed on the second gate electrode layer,
wherein a mole ratio of Ta to a total of C and Ta, (Ta/(Ta+C)), is larger than 0.5 in the first gate electrode layer and the second gate electrode layer.

According to a third aspect of the present disclosure, there is provided a semiconductor device, which includes:
a semiconductor substrate,
a p-channel MIS transistor formed on the semiconductor substrate, the p-channel MIS transistor having a first gate dielectric formed on the semiconductor substrate, a first lower gate electrode layer formed on the first gate dielectric and including Ta and C, a first upper gate electrode layer composed of a first metal and formed on the first lower gate electrode layer, and a first polysilicon layer formed on the first upper gate electrode layer, and
an n-channel MIS transistor formed on the semiconductor substrate, the n-channel MIS transistor having a second gate dielectric formed on the semiconductor substrate, a second lower gate electrode layer formed on the second gate dielectric and having the same composition and orientation as those of the first gate dielectric, a second upper gate electrode layer composed of a second metal and formed the second lower gate electrode layer, and a second polysilicon layer formed on the second upper gate electrode layer, wherein a mole ratio of Ta to a total of C and Ta, (Ta/(Ta+ C)), is larger than 0.5 in the first lower gate electrode layer and the second lower gate electrode layer.

BRIEF DESCRIPTION OF THE SEVERAL VIEWS OF THE DRAWING

FIG. 3 is a table illustrating constituent materials and dimensions of the five kinds of specimens;

FIG. 6 is a characteristic chart illustrating a relationship between surface carrier density and electron mobility on five kinds of the specimens;

FIG. 7 is a characteristic chart illustrating a relationship between an $SiO_2$-equivalent gate dielectric thickness at inversion state (Tinv) and a gate leakage current (Jg) of seven kinds of specimens;

FIG. 9A is a bright field image, and FIG. 9B is a dark field image;

FIG. 14 is a characteristic chart illustrating a relationship between a gate voltage and a gate-to-channel capacitance for the five kinds of TaC specimens;

FIG. 20A is a diagram (O1s) illustrating results of backside XPS analysis of specimens #1 and #5;

FIG. 20B is a diagram illustrating TOA (take-off-angle) dependence property of a peak intensity ratio (P2/(P1+P2)) in FIG. 20A;

FIG. 21A is a diagram (Hf4f) illustrating results of backside XPS analysis of specimens #1 and #5;

FIG. 21B is a diagram illustrating TOA dependence property of the peak intensity ratio (P2/(P1+P2)) in FIG. 21A;

DETAILED DESCRIPTION

Figure 1:
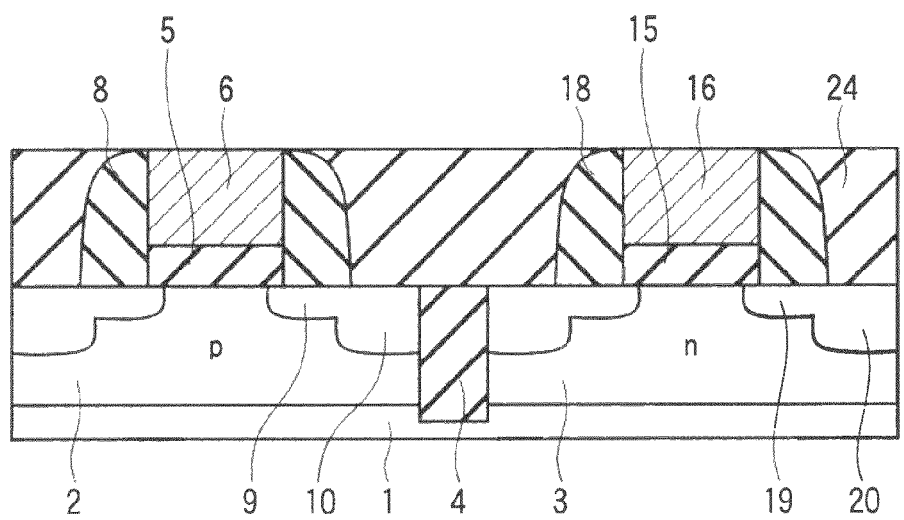
FIG. 1 is a cross-sectional view illustrating a CMIS semiconductor device according to an embodiment.

Prior to description of the embodiments, a basic technique, which is the background to the embodiments, is described. FIG. 1 is a schematic sectional-view illustrating a CMIS semiconductor device, which is a basic structure of the following embodiments. The CMIS semiconductor device has a $Ta_xC_{1-x}$ electrode (x>0.5) of a Ta-rich composition as both gate electrodes of a p-channel MIS transistor and an n-channel MIS transistor. That is to say, the gate electrodes in the embodiments have the same compositions including Ta and C, and a mole ratio of Ta to a total of C and Ta, (Ta/(Ta+C)), is larger than 0.5.

A p-type well 2 and an n-type well 3 are formed on an upper surface (main surface) of a substrate 1 so as to be electrically separated by a device isolating layer 4. The n-channel MIS transistor is formed on the p-type well 2, and the p-channel MIS transistor is formed on the n-type well 3.

As a structure of an n-channel MIS transistor, a pair of n-type extensions 9 are formed in a gate length direction on both sides of a channel region that will be an electric current passage inside the p-type well 2. A pair of n-type deep regions 10 are formed on their exteriors. A junction depth of the n-type deep region 10 is larger than that of the n-type extension 9. A combination of the n-type extension 9 and the n-type deep region 10 functions as a source or drain region of the n-channel MIS transistor.

A gate dielectric 5 is formed on the channel region on the upper surface of the p-type well 2 so as to cover an end portion, which is one end adjacent to the channel region, of the n-type extension 9. A gate electrode 6 is stacked on an upper surface of the gate dielectric 5. The gate electrode 6 is composed of a $Ta_xC_{1-x}$ electrode layer (x>0.5) having a Ta-rich composition. A gate sidewall 8 is formed on both sides of the gate dielectric 5 and the gate electrode 6.

As the structure of the p-channel MIS transistor, a pair of p-type extensions 19 are formed on both gate lengthwise sides of a channel region that is an electric current passage inside the n-type well 3, and a pair of p-type deep regions 20 are formed on their exteriors. A junction depth of the p-type deep region 20 is larger than that of the p-type extension 19. A combination of the p-type extension 19 and the p-type deep region 20 functions as a source or drain region of the p-channel MIS transistor.

A gate dielectric 15 is formed on the channel region on the upper surface of the n-type well 3 so as to cover an end portion of the p-type extension 19, which is one end adjacent to the channel region. A gate electrode 16 is stacked on an upper surface of the gate dielectric 15. The gate electrode 16 is composed of $Ta_xC_{1-x}$ electrode layer (x>0.5) having a Ta-rich composition. A gate sidewall 18 is formed on both sides of the gate dielectric 15 and the gate electrode 16.

A single metal gate technique using a $Ta_xC_{1-x}$ electrode is described in JP-A 2007-149755 (KOKAI) aforementioned. One difference between the present invention and the conventional techniques is that composition x of the $Ta_xC_{1-x}$ electrode layer, which is in contact with the gate dielectric, is larger than 0.5 in the present invention, namely, a Ta-rich composition, but the composition x of the $Ta_xC_{1-x}$ electrode layer is ⅓ or less in JP-A 2007-149755 (KOKAI).

In JP-A 2007-149755 (KOKAI), one of the reasons why the composition x of $Ta_xC_{1-x}$ is 0.5 or less, namely, a C-rich composition, is that the C-rich composition is considered to be necessary for obtaining heat-resistant stability against high-temperature heat treatment.

On the contrary, in the present invention, the following new points were found by experiment. When the composition x of the $Ta_xC_{1-x}$ electrode is made larger than 0.5, a higher inversion layer carrier mobility than in the case of the C-rich composition can be realized, and a gate leakage current property is improved in comparison with a C-rich composition. Also, in the present invention, a reaction between the Ta-rich composition $Ta_xC_{1-x}$ electrode and the gate dielectric at an interface is caused at the time of high-temperature heat treatment as conventionally expected. However, contrary to the conventional expectation, it is newly found that this moderate interfacial reaction does not deteriorate but improves the device properties. Further, by changing the layer thickness of the Ta-rich composition $Ta_xC_{1-x}$ electrode layer, it is possible to control the degree of interfacial reaction between the electrode and the gate dielectric.

In JP-A 2007-165414 (KOKAI), a necessary condition is that the TaC gate electrodes of the nMIS transistor and the pMIS transistor have different orientations. The electrodes need to be fabricated separately for the nMIS and pMIS. In the present invention, the TaC layers with the same composition, the same orientation and the same layer thickness are deposited commonly for nMIS and pMIS at the same timing. That is to say, since the gate electrodes do not need to be separately fabricated, the process is simplified. Since the TaC electrodes of nMIS and pMIS have the same orientation, reactivity with the dielectric is easily controlled.

An influence of the Ta-rich composition of the $Ta_xC_{1-x}$ electrode upon the transistor characteristics, particularly, the inversion layer carrier mobility, the gate leakage current property and an effective work function is described below.

Figure 2:
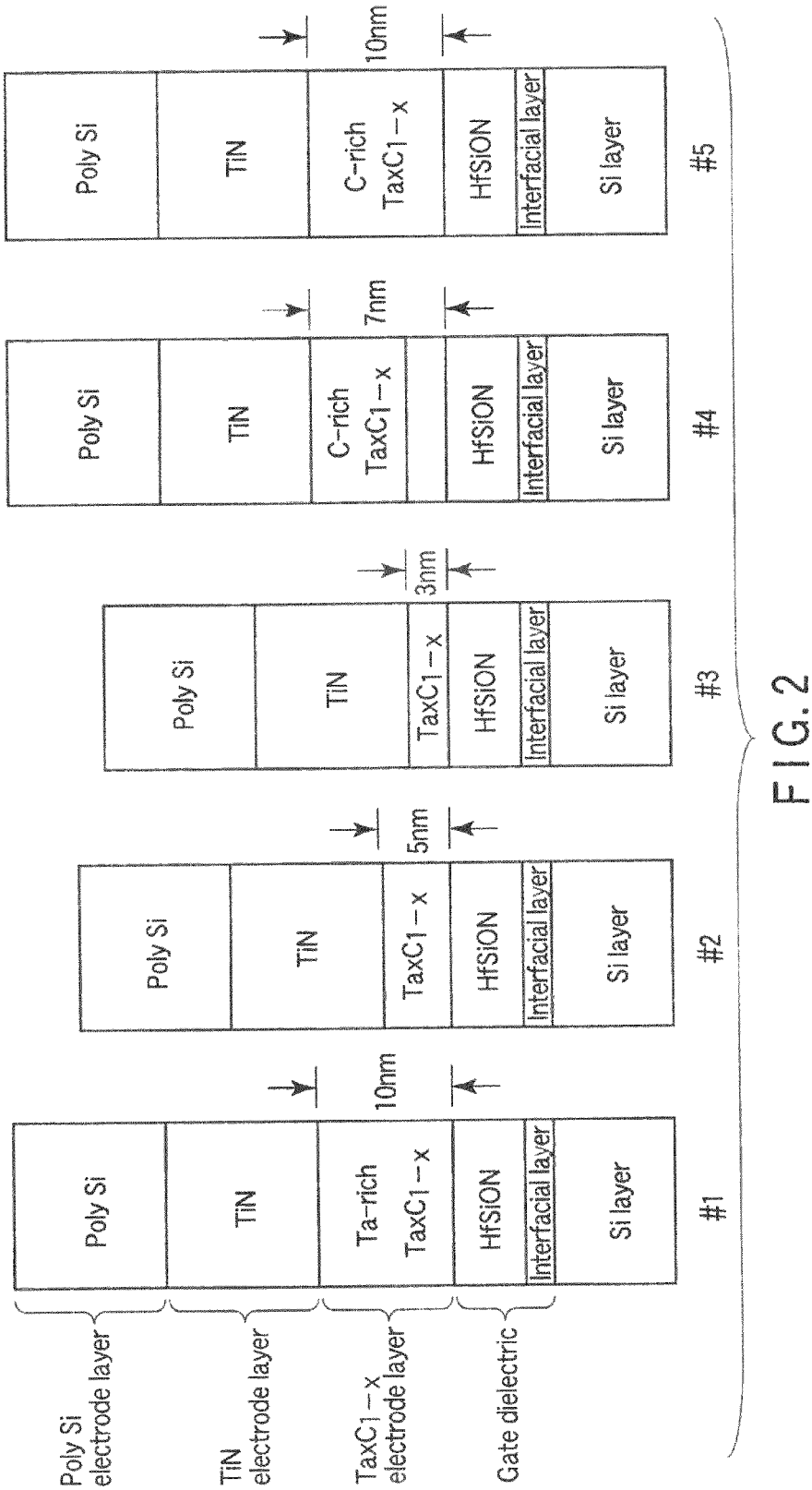
FIG. 2 is a pattern diagram illustrating electrode structures of five kinds of specimens used in a basic experiment.

Such influence is clarified by experimental results of comparing the characteristics of the transistors having five kinds of gate stacked structures with specimen numbers #1 to #5 shown in FIGS. 2 and 3. The specimens #1 to #5 have stacked electrode structures having a $Ta_xC_{1-x}$ electrode layer, a TiN electrode layer and a poly Si layer. Forming conditions of the specimens #1 to #5 are the same except that the compositions and the layer thicknesses of the $Ta_xC_{1-x}$ electrode layer are different. The TiN electrode layers and the poly Si layers have the same property, respectively. Si substrates of #1 to #5 are the same, and they each have an impurity concentration of about $8 \times 10^{16}/cm^3$. Deposition conditions of the gate dielectrics of #1 to #5 are the same. The deposition conditions of the gate dielectrics are the same in #1 to #5 before the formation of the $Ta_xC_{1-x}$ electrode layer, but at the time of the completion of the transistor, their properties is different depending on the degree of the reaction of the dielectrics with the $Ta_xC_{1-x}$ electrode as described later.

The gate dielectric is hafnium silicon oxynitride, namely, HfSiON, whose Hf/(Hf+Si) ratio is 0.5, and [N] density is about 20 atomic %. As shown in FIG. 2, an interfacial layer having a composition close to $SiO_2$ is formed between the HfSiON layer and the Si substrate. The transistors having the gate stacked structures of #1 to #5 are fabricated at a so-called gate-first process including a step of high-temperature heat treatment at about 1000° C. after the formation of the gate stacked structure.

The $Ta_xC_{1-x}$ electrode layers of #1 to #5 are described next. All the $Ta_xC_{1-x}$ electrode layers of #1 to #5 are deposited by the sputtering method. #1, #2 and #3 have a $Ta_xC_{1-x}$ electrode layer having a Ta-rich composition, and their layer thicknesses are 10 nm, 5 nm and 3 nm. On the other hand, #5 has a $Ta_xC_{1-x}$ electrode layer having a C-rich composition, and its layer thickness is 10 nm. Further, the $Ta_xC_{1-x}$ electrode layer of #4 has a layer thickness of about 7 nm, and a portion in contact with the gate dielectric is Ta-rich within a range of several nm. However, the other residual portion in contact with the TiN electrode has a C-rich gradient composition profile. In other words, the electrode layer of #4 has a stacked structure including a Ta-rich layer and C-rich layer.

Figure 4:
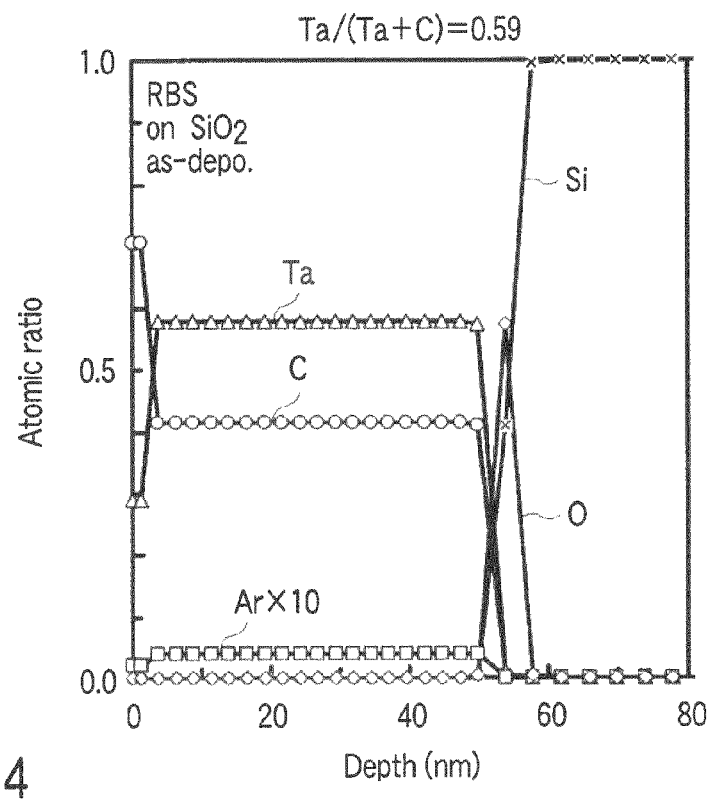
FIG. 4 is a characteristic chart illustrating a relationship between a depth and an atomic ratio of constituent atoms in a TaC electrode (as deposited on $SiO_2$) with a Ta mole ratio of 0.59.
Figure 5:
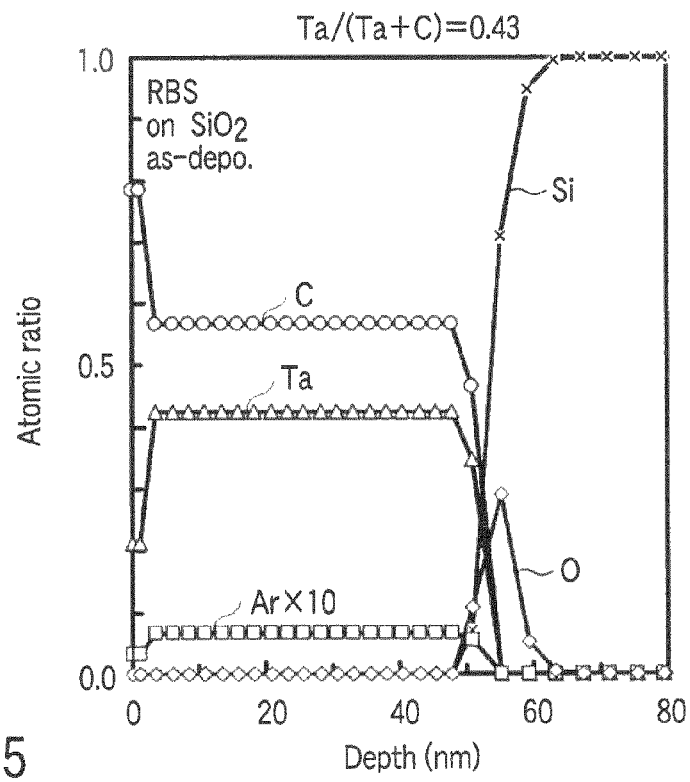
FIG. 5 is a characteristic chart illustrating a relationship between a depth and an atomic ratio of constituent atoms in a TaC electrode (as deposited on $SiO_2$) with a Ta mole ratio of 0.43.

The composition x of the Ta-rich composition $Ta_xC_{1-x}$ electrode layers of #1 to #3 is 0.59, and the composition x of the C-rich composition $Ta_xC_{1-x}$ electrode layer of #5 is 0.43. This composition is specified by Rutherford backscattering spectroscopy (RBS) analysis for a specimen where the $Ta_xC_{1-x}$ layer with thickness of 50 nm is deposited on the Si substrate having an $SiO_2$ layer on its surface under the same composition conditions as #1 to #3, and a specimen where the $Ta_xC_{1-x}$ layer with thickness of 50 nm is formed under the same composition conditions as #5 in the state as deposited. The result in the case of the same composition as #1 to #3 is shown in FIG. 4, and the result in the case of the same composition as #5 is shown in FIG. 5. As the results of the RBS measurement, O density and Ar density in the $Ta_xC_{1-x}$ layer are equal to or less than a detection limit and are 0.01 atomic % or less. It is confirmed by RBS measurement that the composition of the $Ta_xC_{1-x}$ layer in the case of the same composition as #1 to #3 is not changed in the cases of the heat treatment at about 1000° C. and the formation on the HfSiON layer.

FIGS. 4 and 5 show the results of using the specimens for analysis on the $Ta_xC_{1-x}$ layer/gate dielectric/Si substrate. The composition of the $Ta_xC_{1-x}$ layer can be surely measured in the completed transistor. In this case, the composition ratio of C to Ta can be measured by energy dispersive X-ray analysis (EDX) or electron energy-loss spectroscopy (EELS) after cutting out a portion of the gate electrode by focused-ion-beam (FIB) pick-up method. In this case, since an electron beam of the TEM method is used, positioning accuracy of an analysis position is high. As a result, the composition of the $Ta_xC_{1-x}$ layer in the region in contact with the gate dielectric, which is strongly relating to reaction controllability of $Ta_xC_{1-x}$ layer/gate dielectric, can be measured.

In the case of the Ta-rich composition $Ta_xC_{1-x}$ electrode layer of the present invention, an inversion layer carrier mobility is higher than in the case of the C-rich composition $Ta_xC_{1-x}$ electrode layer of the conventional technique. This is explained below. FIG. 6 shows the inversion layer electron mobility of the transistors having the gate stacks of #1 to #5. The ordinate axis (log scale) represents the inversion layer electron mobility $\mu$ ($cm^2/Vs$), and the abscissa axis (log scale) represents the inversion layer electron density Ns ($/cm^2$). In the case of #1 to #4, a high mobility is obtained, but in the case of #5, the mobility is significantly lower than that of #1 to #4. That is to say, when the composition of the $Ta_xC_{1-x}$ electrode on the portion in contact with the gate dielectric is Ta-rich, a significantly higher mobility than that in the C-rich case can be obtained.

The specimen #4 shows a mobility curve which is approximately the same as that of #2 and shows the greatly higher mobility than that of #5. It is found the composition x of the $Ta_xC_{1-x}$ electrode layer on the interface with respect to the gate dielectric is a key factor for determining the mobility, and even if the composition on the upper region away from the interface is C-rich, this upper region does not deteriorate the mobility. This result is different from the conventional expectation that the transistor property might be deteriorated due to reaction of the electrode layer having a Ta-rich composition with the gate dielectric. Since the inversion layer carrier mobility is a physical value which is directly related to the current drive performance of the transistor, FIG. 6 shows the superiority of the $Ta_xC_{1-x}$ electrode layer with a Ta-rich composition in view of the performance improvement of CMIS.

When the specimens #1 to #3 having the Ta-rich composition $Ta_xC_{1-x}$ electrode layer are compared, their mobility establishes a relationship of #1>#2>#3. That is to say, in the case of the same Ta-rich composition, as the thickness of the $Ta_xC_{1-x}$ electrode layer becomes larger, the mobility becomes higher.

In the case of the Ta-rich composition $Ta_xC_{1-x}$ electrode layer of the present invention, the gate leakage current property is further improved with respect to the case of the C-rich composition $Ta_xC_{1-x}$ electrode layer of the conventional technique. FIG. 7 shows the results of gate leakage current measurements of the transistors having the gate stacks of #1 to #5. The ordinate axis represents the gate leakage current Jg (A/cm$^2$), and the abscissa axis represents the $SiO_2$-equivalent gate dielectric thickness at inversion state, Tinv (nm). Jg and Tinv are values obtained by evaluation under a gate bias condition such that an electric field (Eox) on a channel/interfacial layer interface becomes 4.5 (MV/cm).

FIG. 7 also shows results of specimens #1' and #1" whose gate dielectric thickness is different from that of #1, and substrate, composition of the gate dielectric and condition of the gate electrode stacked portion are the same as those of #1. In the specimen #1', only the thickness of the gate dielectric is intentionally thinned, and in the specimen #1", the thickness is thickened.

The lower the Tinv, the higher the current drive performance of the transistor becomes, while the smaller the Jg, the lower the power consumption of the transistor becomes. Therefore, in view of both the current drive performance and the power consumption of the transistor, the specimen on a lower-left region in a Jg-Tinv characteristic chart of FIG. 7, namely, the specimen which realizes smaller Tinv and smaller Jg is excellent in performance. Since the specimens #2, #3 and #4 are approximately on the trend line shown by a black solid line obtained by connecting #1', #1 and #1" linearly, the specimens #2 to #4 can show a gate leakage current property approximately equivalent to that of #1.

On the other hand, since the specimen #5 is positioned on an upper-right region with respect to the solid line, the gate leakage current property of #1 is more excellent than that of #5. Therefore, when the composition of the $Ta_xC_{1-x}$ electrode layer on the portion in contact with the gate dielectric is Ta-rich, the gate leakage current property is more excellent than in the C-rich case. This result is different from the conventional expectation such that when the electrode layer having the Ta-rich composition reacts with the gate dielectric, the transistor characteristic is deteriorated.

Figure 8:
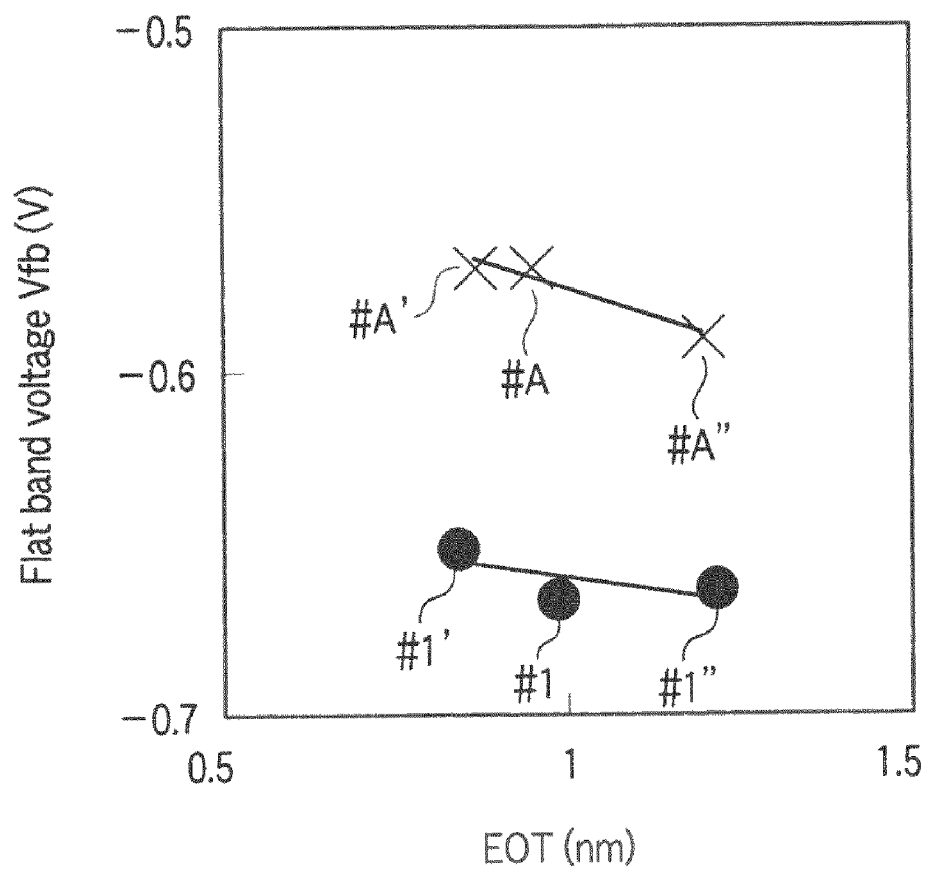
FIG. 8 is a characteristic chart illustrating a relationship between EOT and a flat band voltage of the specimen #1 and its descendant specimen.

The effective work function (EWF) of the gate stacks in the Ta-rich composition $Ta_xC_{1-x}$ electrode layer of the present invention is suitable for the single metal gate technique. This is described below. FIG. 8 illustrates a relationship between Vfb of the gate stack of #1', #1 and #1" and an equivalent oxide thickness (EOT). A series of plots #A', #A and #A" in FIG. 8 represent the relationship between Vfb and EOT of the specimens formed under the same conditions including the methods for forming the gate dielectric and the gate electrode except that a method for forming the interfacial layer is different from that of #1', #1 and #1".

The result of FIG. 8 shows that EWF of the gate stack in the Ta-rich composition $Ta_xC_{1-x}$ electrode layer of the present invention depends on the formation condition of interfacial layer and varies by about 50 mV, and the EWF falls within a range of about 4.4 to 4.5 eV. the EWF is within a range of suitable values for the single metal gate technique, for example, the range of 4.4 eV to 4.8 eV.

Threshold voltages of the n-channel MIS transistor and the p-channel MIS transistor of CMIS should be normally set to be symmetrical, namely, such that values are the same and sings are opposite. When small threshold voltages are needed, EWF of the n-channel MIS transistor is set to be less than 4.6 eV corresponding to a value of a mid gap, and further about 4.1 eV corresponding to the value of n-type band edge. EWF of the p-channel MIS transistor should be set to be larger than 4.6 eV corresponding to the value of the mid gap, and further a value of about 5.1 eV corresponding to the value of p-type band edge.

In the single metal gate technique, an element for adjusting a threshold voltage is added to the gate dielectric, Si as a conventional channel material is changed with an alternative channel material, or an element for adjusting the threshold voltage is added to a substrate. As a result, a complementary threshold voltage and low threshold voltage can be realized.

In order to set EWF of the n-channel MIS transistor close to the value of the n-type band edge, it is effective that an element such as La, Ce, Pr, Tb, Dy, Er, Yb, Y, Mg, Sr and Ba is added into the gate dielectric, or nitrogen (N) ions are implanted into the substrate.

In order to set EWF of the p-channel MIS transistor close to the value of the p-type band edge, it is effective that an element such as Al or O is added to the gate dielectric, fluorine (F) ions are implanted into the Si substrate, or the channel material is changed from Si to SiGe.

To obtain a complementary threshold suitable for CMIS by single metal gate technique, these techniques are suitably combined. For the combination of the metal gate electrode and the base dielectric before application of the threshold adjusting technique, preferable EWF values are within a range of vicinities of the mid gap, for example, about 4.4 eV to 4.8 eV, and the gate stacks of the Ta-rich composition $Ta_xC_{1-x}$ electrode layer of the present invention can satisfy this range.

The Ta-rich composition $Ta_xC_{1-x}$ electrode layer of the present invention is more preferable as the single gate electrode for high-performance CMIS devices from three viewpoints of mobility property, Jg-Tinv property and EWF than the conventional C-rich composition $Ta_xC_{1-x}$ electrode layer.

Figure 9A:
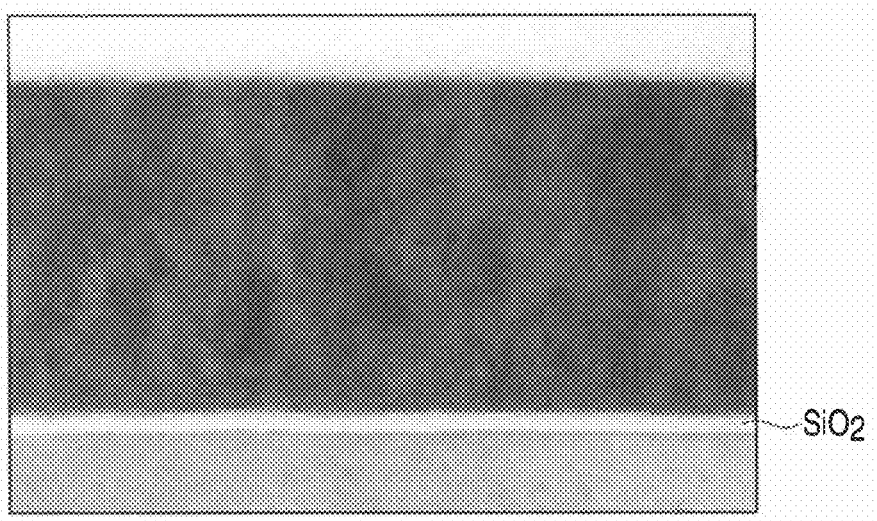
FIGS. 9A and 9B are TEM images showing that a Ta-rich TaC layer of the present invention is polycrystal.
Figure 9B:
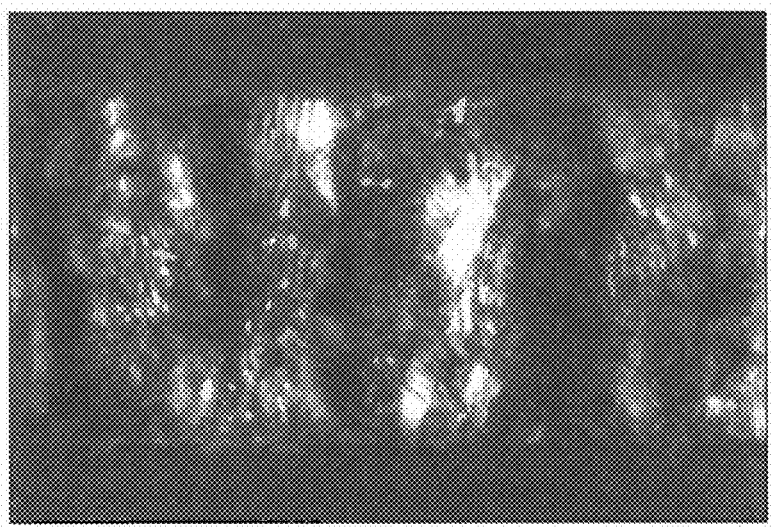

Another characteristic of the present invention is that the Ta-rich composition $Ta_xC_{1-x}$ electrode layer is a polycrystalline structure including the NaCl prototype structure. FIGS. 9A and 9B are cross-sectional TEM images obtained after the $Ta_xC_{1-x}$ layer with a thickness of 50 nm deposited under the same composition conditions as #1, #2 and #3 after a heat treatment at 1000° C. FIG. 9A is a bright field image, and FIG. 9B is a dark field image. FIGS. 9A and 9B show that the Ta-rich $Ta_xC_{1-x}$ layer of the present invention has a polycrystalline structure.

Figures 10A, 10B:
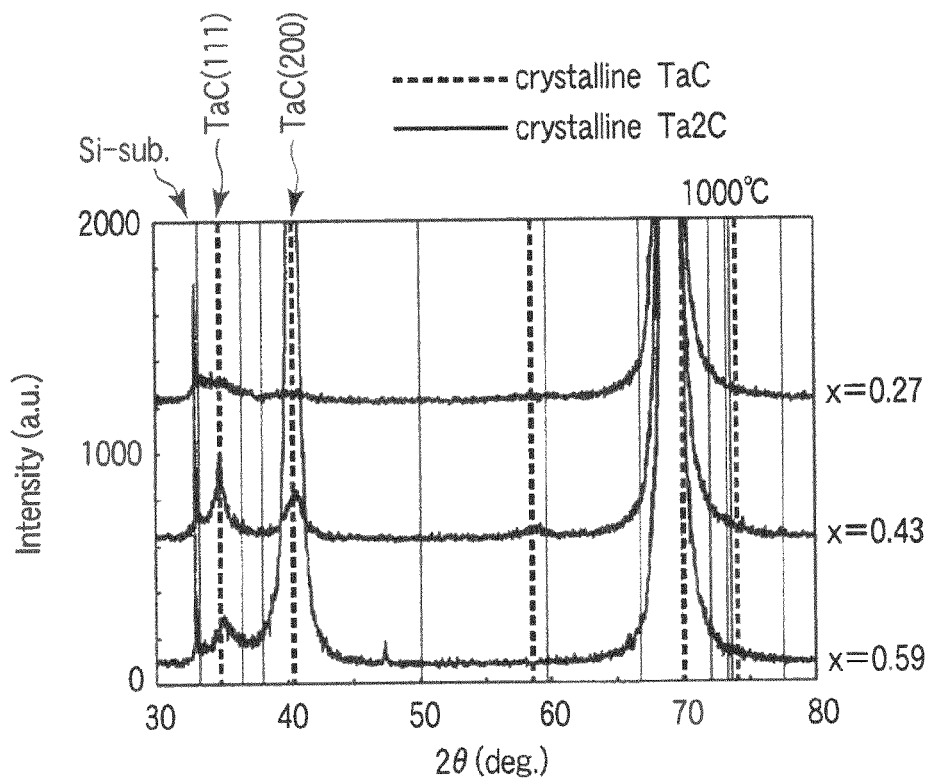
FIG. 10A is a diagram illustrating results of XRD-analysis of the TaC specimen thermally treated at 1000° C. when the Ta mole ratio is 0.59, 0.43 and 0.27.
FIG. 10B is a table showing orientation ratios after the heat treatment at 1000° C.
Figures 11A, 11B:
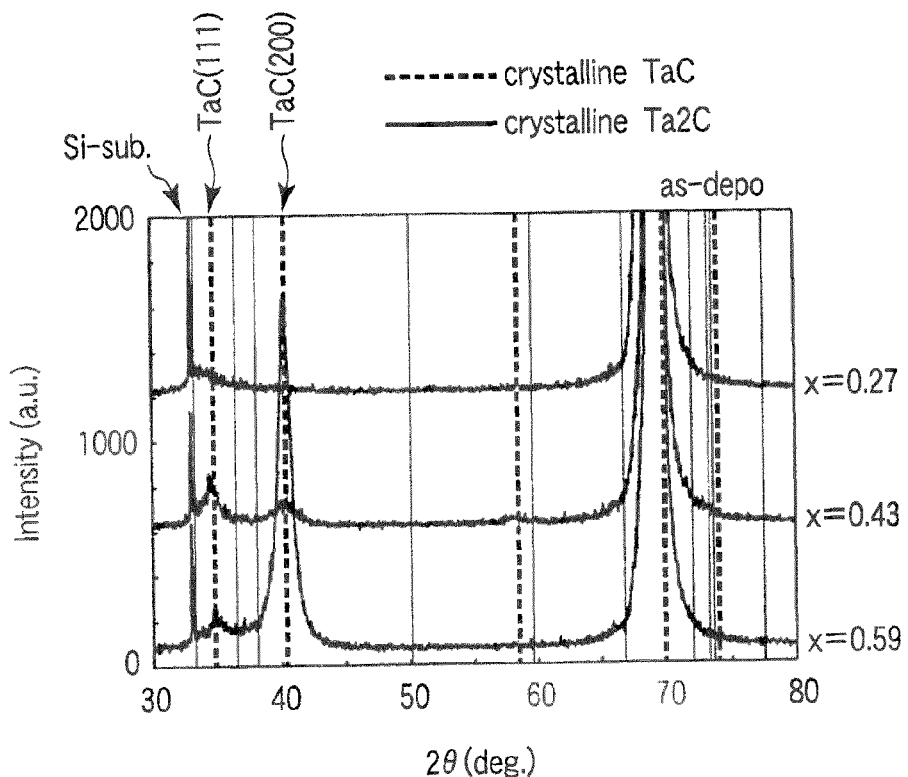
FIG. 11A is a diagram illustrating results of XRD-analysis of thermally untreated TaC specimens when the Ta mole ratio is 0.59, 0.43 and 0.27.
FIG. 11B is a table showing orientation ratios of the thermally untreated TaC specimens.

FIGS. 10A and 11A illustrate results of XRD analysis on the $Ta_xC_{1-x}$ layers (layer thickness is 50 nm) deposited under the condition of the same composition as #1 to #3 (x=0.59), the condition of the same composition as #5 (x=0.43) and another condition (x=0.27). FIGS. 10A and 11A show results for specimens to which a high-temperature heat treatment at about 1000° C. is carried out, and a specimen in the state as deposited (as depo.).

It is known that two stable crystalline structures of TaC crystal ($Ta_xC_{1-x}$: X=0.5) and Ta2C crystal ($Ta_xC_{1-x}$: x=2/3) are present for an alloy including Ta and C, namely, the tantalum carbide series. A structure prototype of a TaC crystal layer is an NaCl type cubic crystal, and a Ta2C crystal layer is a CdI2 type laminate crystal. In FIGS. 10A and 11A, solid and dotted lines, respectively, show peak positions attributed to Ta2C crystalline and TaC crystalline structure.

From FIGS. 10A and 11A, it is found that both in the cases where the same composition condition as #1, #2 and #3, x=0.59 and the same composition condition as #5, x=0.43, the TaC crystalline structure is obtained. Since the TaC crystalline structure is the so-called NaCl type structure, the $Ta_xC_{1-x}$ layers of #1, #2, #3 and #5 are composed of the NaCl type structure.

FIGS. 10B and 11B are tables showing TaC (200) orientation ratio and TaC (111) orientation ratio in the specimens shown in FIGS. 10A and 11A. Here, the orientation ratio of TaC (200) is with respect to the normal direction to the interfaces between the gate electrode and gate dielectric and is obtained according to the following formula.

TaC (200) orientation ratio=TaC (200) peak intensity/ {TaC (111) peak intensity+TaC (200) peak intensity} (1)

The TaC (111) orientation ratio is obtained by replacing a numerator in the formula (1) by the TaC (111) peak intensity. From FIGS. 10B and 11B, it is found that the crystal orientation ratio of the TaC (200) face is larger than 50% in the Ta-rich composition $Ta_xC_{1-x}$ layer of the present invention. That is to say, in the present invention, the crystal orientation ratio of the TaC (200) face with respect to the normal line direction of the interface between the gate electrode layer and the gate dielectric, [TaC (200) face/{TaC (200) face+TaC (111) face}], is larger than 50%.

In the TaC crystalline structure, the TaC (200) face is a face where Ta and C are arranged alternatively. On the other hand, two different faces, i.e. a Ta face and a C face, are present on the TaC (111) face, and the Ta face is considered to have higher interfacial reactivity. In the present invention, reactivity between TaC and the dielectric should be controlled, but in the case of (111) orientation, the reactivity varies not only due to the composition but also due to which of the Ta face and the C face contacts with the dielectric at a higher ratio. Therefore, in order to control the reactivity more precisely, the (200) orientation is more preferable to control the reactivity. In the case of the (200) orientation, the reactivity can be controlled by controlling the amount of excess Ta and C vacancies which depend on the composition and the layer thickness. Excess Ta and the C vacancies are described later with reference to FIGS. 12 and 13.

FIGS. 10A, 10B, 11A and 11B show the results of XRD measurement for specimens having the stacks of the $Ta_xC_{1-x}$ layer/gate dielectric/Si substrate. Here, the specimens is prepared for the analysis. The crystalline ratio of the $Ta_xC_{1-x}$ layer can be measured also in a completed transistor. In this case, the crystal orientation ratio of a TaC (200) face to a TaC (111) face in the normal direction to the interfaces can be measured by transmission electron diffraction (TED) after cutting out a portion of the gate stack by focused-ion-beam (FIB) pick-up method. Since in this case a finely-focused electron beam is used, like in the case of TEM measurement, the positioning accuracy of the analyzing position is high. As a result, the orientation of the $Ta_xC_{1-x}$ layer in the region in contact with the gate dielectric, which is strongly related to the controllability of reaction between the $Ta_xC_{1-x}$ layer and the gate dielectric, can be measured.

Figure 12:
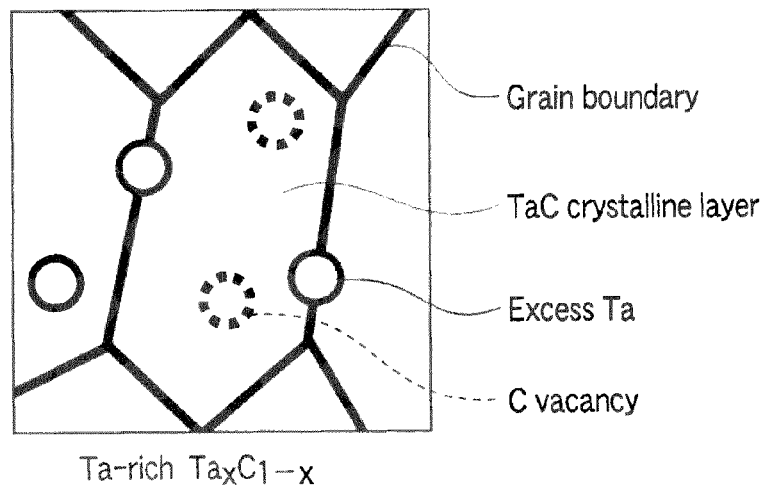
FIG. 12 is a pattern diagram illustrating excess Ta and C vacancies on the Ta-rich TaC layer.

The Ta-rich $Ta_xC_{1-x}$ layer of the present invention has a polycrystalline structure composed of a TaC crystalline phase corresponding to x=0.5 regardless of the Ta-rich composition with x=0.59. This shows that excess Ta is present in a TaC crystal or a crystal grain boundary, or C vacancies are generated in a TaC crystal as shown in FIG. 12.

Figure 13:
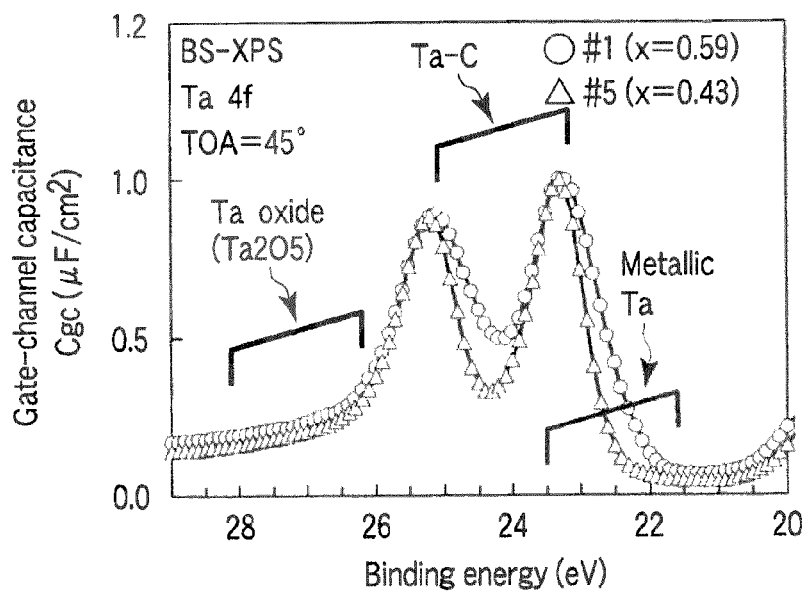
FIG. 13 is a backside XPS-analysis spectrum (Ta4f) for device wafers equivalent to #1 and #5.

FIG. 13 illustrates a spectrum of Ta4f (7/2, 5/2) in the results of backside-XPS analysis conducted on a device wafer equivalent to #1 and #5. FIG. 13 illustrates peak positions corresponding to a binding state of Ta in each of metallic Ta, TaC, and Ta oxide.

From FIG. 13, it is found that Ta is mainly in a TaC binding state in both #1 and #5. It is found that the component in the lower-energy side from the position corresponding to the TaC binding state is larger for #1 than for #5. This means the amount of Ta whose number of adjacent C atoms is less than 4 is larger for #1. Such Ta is present in a site adjacent to the C vacancy in the TaC crystal or in the crystal grain boundary.

The Ta-rich composition $Ta_xC_{1-x}$ electrode is a polycrystal composed of a TaC crystalline phase including excess Ta or C vacancies. The excess Ta or the C vacancy is considered to increase the reactivity of the $Ta_xC_{1-x}$ electrode. According to the XRD results in FIGS. 10A, 10B, 11A and 11B, the crystal orientation ratio of the Ta-rich composition $Ta_xC_{1-x}$ electrode and its crystallinity are increased at the time of the heat treatment at 1000° C. At this time, it is expected that the excess Ta is segregated onto a $Ta_xC_{1-x}$/HfSiON interface, and the reactivity of the interface becomes high.

A preferable range of the layer thickness of the Ta-rich composition $Ta_xC_{1-x}$ electrode layer of the present invention is described hereinafter. Prior to this, description is given as regards the reaction and its amount of the electrode layer of the present invention with the gate dielectric, which depends on the layer thickness of the electrode layer.

Figure 15:
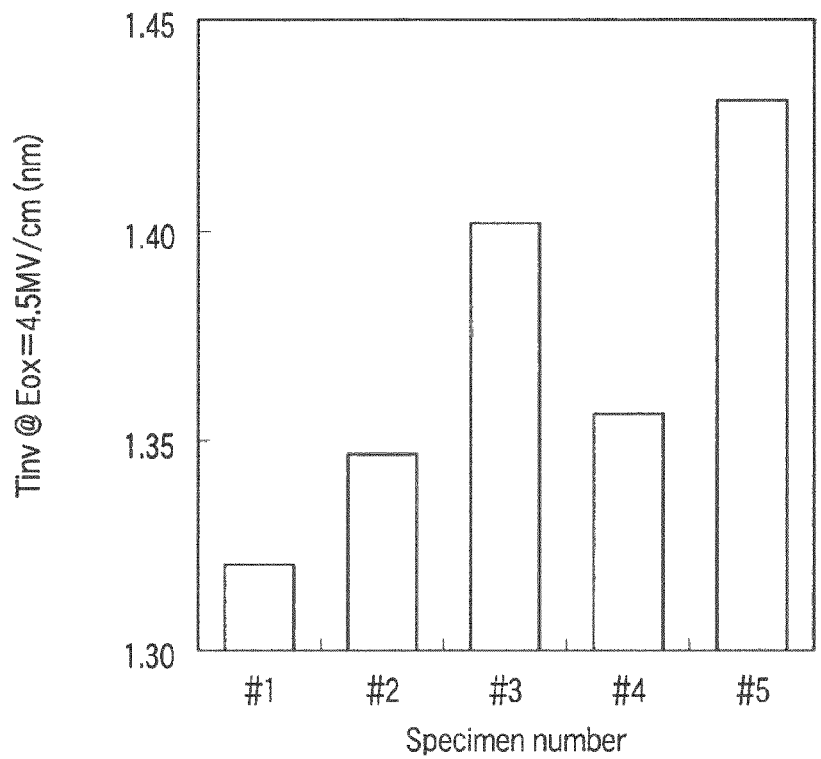
FIG. 15 is a diagram illustrating Tinv of the five kinds of specimens.

FIG. 14 shows a gate-channel capacity Cgc ($\mu F/cm^2$) as a function of a gate voltage Vg(V) for transistors having a gate stacked structure of #1 to #5. FIG. 15 shows a value of Tinv obtained from the Cgc-Vg characteristic in FIG. 14. The value of Tinv varies among the specimens #1 to #5. Since the gate dielectrics of #1 to #5 are deposited under the same condition, the thicknesses are the same before the formation of the $Ta_xC_{1-x}$ electrode layer. On the other hand, the result in FIG. 15 shows that the gate dielectrics of the specimens #1 to #5 are different from each other at the time of completion of the transistor. The difference is caused by the reaction between the $Ta_xC_{1-x}$ electrode and the gate dielectric on the interface.

In the specimens #1 to #4 corresponding to the case of the Ta-rich composition $Ta_xC_{1-x}$ electrode layer of the present invention, the values of Tinv become smaller than that of #5 corresponding to the case of the C-rich composition $Ta_xC_{1-x}$ electrode layer as the conventional technique. This means that the reaction between the $Ta_xC_{1-x}$ electrode and the gate dielectric is noticeable in the case of the Ta-rich composition $Ta_xC_{1-x}$ electrode layer, and in this case Tinv becomes small. Factors which reduce Tinv are two, that is, a physical reduction in a film thickness of the gate dielectric and an increase in dielectric constant of the gate dielectric. As described later with reference to FIGS. 17A to 20B, physically analyzed results, which show that both of the factors are effective in the case of the Ta-rich composition $Ta_xC_{1-x}$ electrode layer, are present. When the specimens #1 to #3 having the Ta-rich composition $Ta_xC_{1-x}$ electrode layer are compared, Tinv establishes a relationship: #1<#2<#3.

Figure 16:
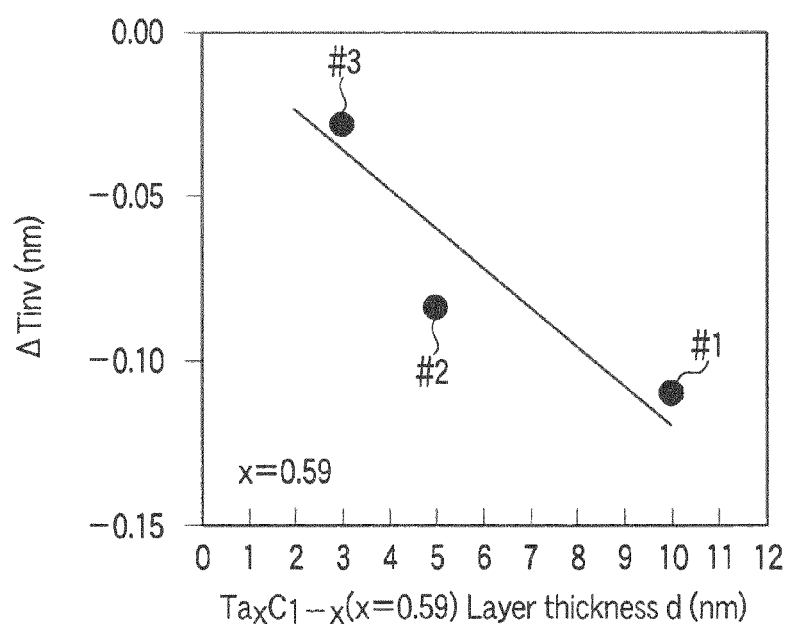
FIG. 16 is a diagram illustrating a relationship between a layer thickness of the TaC specimen whose Ta mole ratio is 0.59 and ΔTinv, wherein ΔTinv is a reduction of Tinv with respect to the Tinv of the TaC specimen whose Ta mole ratio is 0.43.

FIG. 16 illustrates a relationship between a reduction in Tinv (ΔTinv) of the specimens #1 to #3 with respect to the Tinv of the specimen #5 and the layer thickness of the Ta-rich composition $Ta_xC_{1-x}$ electrode layer. As the thickness of the Ta-rich composition $Ta_xC_{1-x}$ electrode layer is larger, the reduction amount of Tinv becomes larger, and the relationship is approximately proportional within the range investigated. Therefore, as the Ta-rich composition $Ta_xC_{1-x}$ electrode layer is thicker, the reaction on the interface between the electrode and the gate dielectric is more noticeable.

As to a reason for this dependence of ΔTinv on thickness of the Ta-rich composition $Ta_xC_{1-x}$ electrode, an absolute amount of the excess Ta becomes larger with increasing thickness of the Ta-rich composition $Ta_xC_{1-x}$ electrode, and the amount of excess Ta segregated onto the $Ta_xC_{1-x}$/HfSiON interface becomes large at the time of the heat treatment at 1000° C.

The absolute value ΔTinv of the reduction in the electric film thickness Tinv is about 0.1 nm in the case of the specimen #1 where the value becomes maximum within the range investigated at this time, and this value corresponds to reduction of the physical film thickness by approximately 0.3 nm when assuming the dielectric constant of HfSiON is 12. On the other hand, diameters of an $HfO_4$ molecule or $SiO_4$ molecule as a building block structure of HfSiON are about 0.3 nm. Therefore, the interface reaction caused by the Ta-rich composition $Ta_xC_{1-x}$ electrode layer is a phenomenon which occurs within a thickness range corresponding to an atomic layer or two atomic layers.

A preferable layer thickness range of the Ta-rich composition $Ta_xC_{1-x}$ electrode layer of the present invention is described below. The layer thickness of the Ta-rich composition $Ta_xC_{1-x}$ electrode layer of the present invention is preferably 0.5 nm or more, preferably 20 nm or less, and more preferably 10 nm or less.

An upper limit of the layer thickness of the Ta-rich composition $Ta_xC_{1-x}$ electrode layer which produces a preferable effect for the operation of the transistor is described first. As shown in FIG. 6, when the specimens #1 to #3 are compared, the mobility is such that #1>#2>#3. Therefore, a larger thickness of the Ta-rich composition $Ta_xC_{1-x}$ electrode layer produces a higher mobility, and the mobility is not saturated within the range of the electrode layer thickness investigated at this time.

As shown in FIG. 16, a larger thickness of the Ta-rich composition $Ta_xC_{1-x}$ electrode layer results in a larger reduction ΔTinv in Tinv, and the reaction between the electrode and the gate dielectric on the interface is noticeable. When the reaction between the electrode and the gate dielectric on the interface is too excessive, the gate leakage property might be deteriorated. However, as shown in FIG. 7, since the specimens #1 to #3 are on the same trend line of Jg-Tinv property, the leakage current property is not deteriorated within the range investigated at this time. Therefore, the upper limit of the layer thickness of the Ta-rich composition $Ta_xC_{1-x}$ electrode layer which results in the preferable effect for the operation of the transistor is at least 10 nm or more.

The upper limit of the Ta-rich composition $Ta_xC_{1-x}$ electrode layer is defined by requisition from a viewpoint of the following processability. As the layer thickness of the metal electrode layer becomes larger, so does the difficulty in dry etching at the time of gate patterning. The physical gate length at the generation of integrated circuit when the metal gate technique is applied is about 45 nm or less. The upper limit of the layer thickness of the metal electrode layer is about 20 nm from the viewpoint of the processability.

A lower limit of the layer thickness of the Ta-rich composition $Ta_xC_{1-x}$ electrode layer which results in a preferable effect for the operation of the transistor is described. As described about the comparison of the mobility of the specimens #1 to #5 in FIG. 6, the composition x of the $Ta_xC_{1-x}$ electrode layer on the interface between the gate dielectric and the electrode layer is a key factor for determining the mobility. As is clear from the example #3, when the layer thickness is 3 nm, a mobility greatly higher than that of the C-rich composition $Ta_xC_{1-x}$ electrode layer of the conventional technique is obtained. For this reason, the lower limit of the layer thickness necessary for producing the effect of the present invention is 3 nm or less.

The composition and the layer thickness of the $Ta_xC_{1-x}$ electrode for obtaining the effect equivalent to that of #3 with thin layer thickness are designed based on the finding of the present invention. Accordingly, the lower limit of the layer thickness necessary for producing the effect of the present invention is obtained.

When the specimens #1 to #3 are compared, the mobility is higher in the order of #1, #2 and #3 as shown in FIG. 6, and the reduction ΔTinv in Tinv becomes larger in the same order as shown in FIG. 16. According to FIGS. 6 and 16, a correlation such that a larger ΔTinv produces a higher mobility is found. This correlation holds in the specimens #4 and #5 as well.

The physical cause for this is as follows. At the time of forming the electrode layer, defects in inter-atomic binding due to process damage are present in an region near the interface between the $Ta_xC_{1-x}$ electrode layer and the gate dielectric. In the case of the Ta-rich composition $Ta_xC_{1-x}$ electrode layer of the present invention, interfacial reaction between the electrode and the gate dielectric is caused at the time of high-temperature anneal at about 1000° C., so that the defective layer near the interface can be reactively removed. As the reaction progresses, in other words, the reduction ΔTinv in Tinv becomes larger, the defective layer can be removed more completely, and the inversion layer mobility rises. For this reason, the mobility depends on ΔTinv.

On the other hand, in the case of the conventional C-rich composition $Ta_xC_{1-x}$ electrode layer, the interfacial reaction between the electrode and the gate dielectric is not caused. Due to this, the defective layer at the time of forming the electrode layer is maintained, and the inversion layer mobility becomes lower than that of the present invention. As described later with reference to FIG. 21, there are results of physical analysis representing that the binding state between the electrode and the gate dielectric is different in the Ta-rich composition $Ta_xC_{1-x}$ electrode layer of the present invention and in the conventional C-rich composition $Ta_xC_{1-x}$ electrode layer.

In order to obtain an effect equivalent to #3 with a thinner layer thickness, ΔTinv which is the same as that of #3 may be realized with thinner layer thickness. In order to realize this, the composition x of the $Ta_xC_{1-x}$ electrode (x>0.5) may be larger than that of #3. As described with reference to FIG. 12, excess Ta is present in the TaC crystal or the crystal gain boundary in the Ta-rich $Ta_xC_{1-x}$ electrode of the present invention, or a C vacancy is generated in the TaC crystal. When an amount of addition of excess Ta and C vacancy is defined as y, y=2x−1. "y" is an index showing the reactivity of the $Ta_xC_{1-x}$ electrode, and a relationship ΔTinv ∝ y holds.

On the other hand, as described with reference to FIG. 16, the thickness d of the Ta-rich composition $Ta_xC_{1-x}$ electrode layer and ΔTinv establish a linear relationship. Therefore, $$\Delta Tinv \propto y*d = (2x-1)*d \qquad (2)$$

The combination of the composition x and the layer thickness d which realizes ΔTinv which is equivalent or not less than #3 is defined by the following formula:

$$(2x-1)*d > (2*0.59-1)*3 \quad (3)$$

According to the formula (3), the smallest thickness d for obtaining an effect equivalent to that of #3 is obtained when x=1, and d>0.54 nm. This means that when a 100% Ta layer of 0.54 nm is inserted between the gate dielectric and the heat-resistant metal layer, such as a C-rich composition $Ta_xC_{1-x}$ electrode layer, an effect equivalent to that of #3 can be obtained.

The reaction between the Ta-rich composition $Ta_xC_{1-x}$ electrode layer and the gate dielectric at the interface is described below. Further, a structural property of the interfacial structure between the Ta-rich composition $Ta_xC_{1-x}$ electrode layer and the gate dielectric is described.

The physically analyzed results of the specimens #1 and #5 are compared. The specimen #1 has the Ta-rich composition $Ta_xC_{1-x}$ electrode layer of the present invention, and the interfacial reaction between the electrode layer and the gate dielectric is noticeable. The specimen #5 has the conventional C-rich composition $Ta_xC_{1-x}$ electrode layer.

Figure 17B:
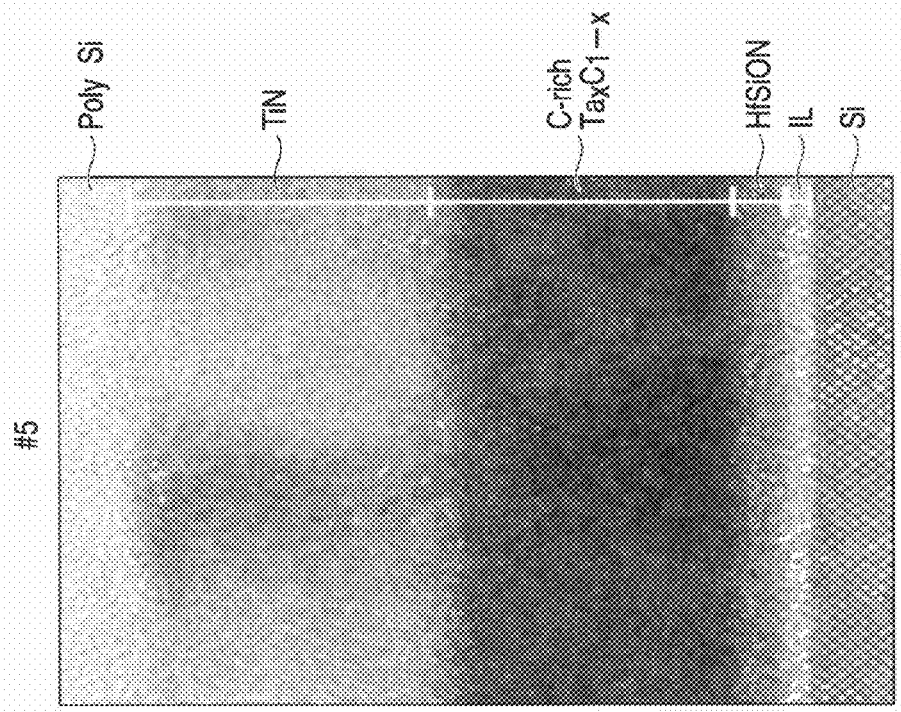
FIG. 17B is a TEM image of a gate stack of specimen #5.
Figure 17A:
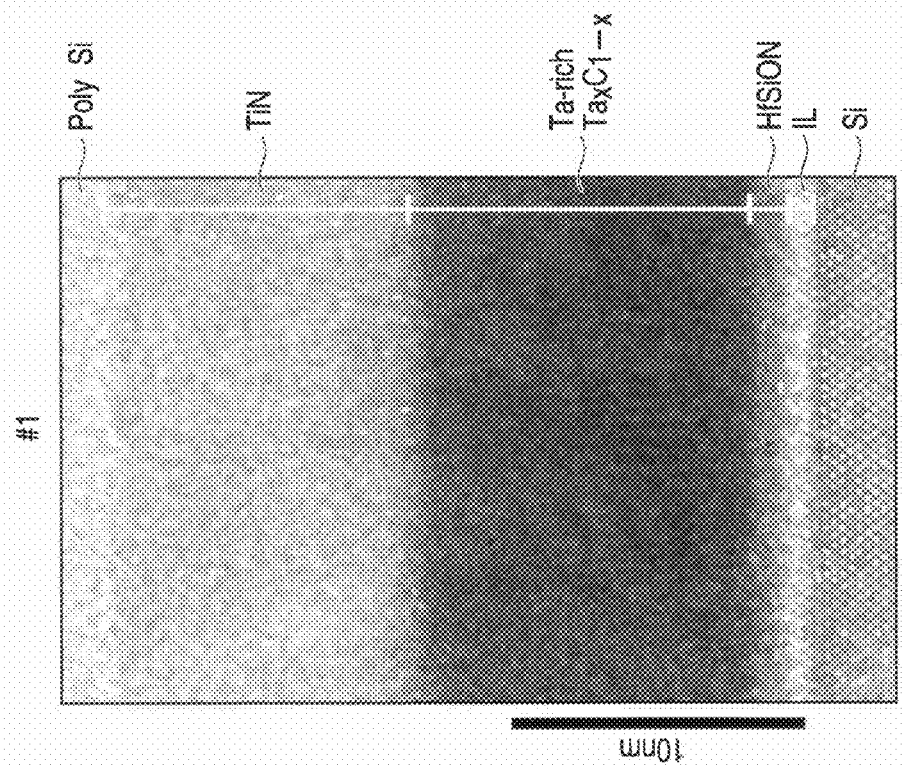
FIG. 17A is a TEM image of a gate stack of specimen #1.

FIGS. 17A and 17B show TEM-images for the gate stacks obtained by cutting out from the specimens #1 and #5. FIGS. 17A and 17B illustrate that the physical film thickness of the gate dielectric (HfSiON) of the specimen #1 is smaller than that of the specimen #5.

Figure 18:
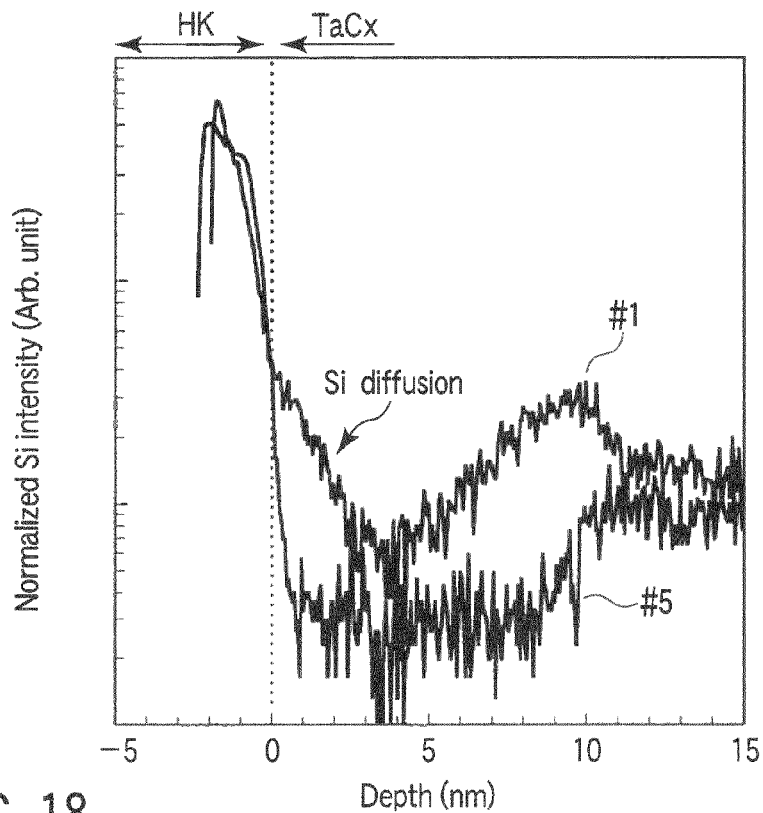
FIG. 18 is a diagram illustrating results of backside SIMS analysis of specimens #1 and #5.

FIG. 18 shows the Si distribution profiles after back-side SIMS-analysis of the specimen cut out from the same wafer as the specimen #1 or #5. FIG. 18 shows that in the case of specimen #1, Si is diffused toward the Ta-rich composition $Ta_xC_{1-x}$ electrode layer from HfSiON due to the interfacial reaction between the electrode and the gate dielectric.

Figure 19:
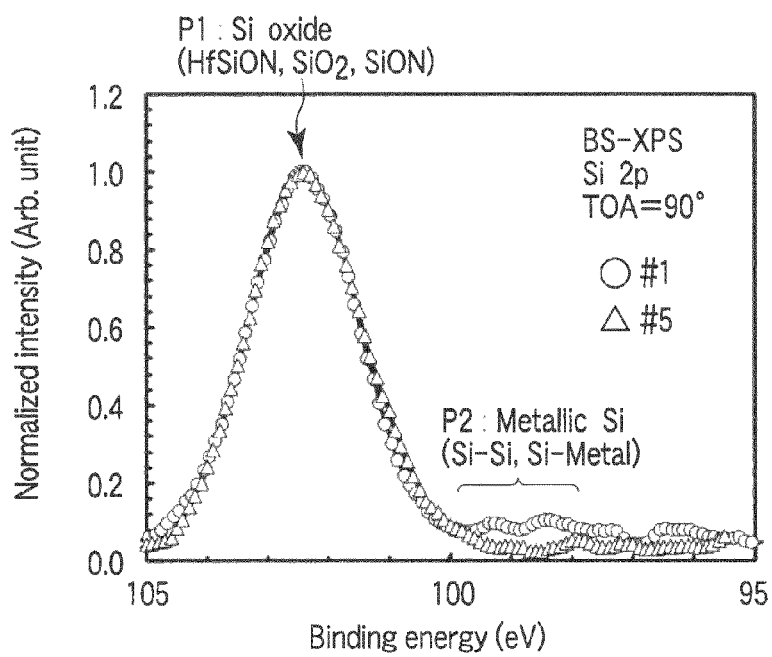
FIG. 19 is a diagram (Si2p) illustrating results of backside XPS analysis of specimens #1 and #5.

FIG. 19 illustrates a spectrum originating from the 2p orbital of Si after back-side XPS-analysis of the specimen cut out from the same wafer as #1 or #5 as. FIG. 19 shows also a peak position (P1) corresponding to Si in HfSiON, $SiO_2$, and SiON and a peak position (P2) corresponding to Si (Si—Ta, Si—C, Si—Si) which is bound to a metal. The P2 component of Si which is bound to a metal is detected only in #1. This shows that Si is present in the Ta-rich composition $Ta_xC_{1-x}$ electrode layer of #1.

FIG. 20A shows a spectrum originating from is orbital of O after back-side XPS-analysis of the specimen cut out from the same wafer as the #1 or #5. FIG. 20A shows also a peak position (P1) corresponding to O (Hf—O—Si, Si—O—Si) in HfSiON, $SiO_2$, and SiON and a peak position (P2) corresponding to O (Hf—O—Hf, Ta—O—Hf, Ta—O—Ta) which is bound to a metal. FIG. 20B shows the take off angle (TOA) dependence of a peak intensity ratio obtained by separating a P1 component and a P2 component. A ratio P2/(P1+P2) of #1 is larger than #5, and the ratio becomes larger as TOA increases.

FIG. 20B shows that an amount of O bound to a metal in #1 is larger than #5, and the amount is larger at a vicinity of the interface between the metal gate (MG) and the gate dielectric (HK). This is because Si is extracted from HfSiON and thus the ratio Hf/(Hf+Si) increases so that HfSiON changes in quality close to $HfO_2$, or Ta, which has reduced HfSiON, forms a Ta—O bond. $HfO_2$ and $TaO_x$ have a higher dielectric constant than that of HfSiON.

FIG. 21A shows a spectrum of Hf4f. FIG. 21A shows also a peak position (P1) corresponding to Hf (Hf—O—Si) in HfSiON and a peak position (P2) corresponding to Hf (Hf—C, Hf—Ta) which is bound to a metal.

FIG. 21B shows a TOA dependence of a ratio P2/(P1+P2). The ratio P2/(P1+P2) of #1 is larger than that of #5, and the ratio becomes larger with TOA increases. FIG. 20B shows that a percentage of Hf bound to Ta or C near the interface between Metal gate and high-k dielectric in #1 is higher than that of #5. This is because O in the Hf—O binding is removed by excess Ta at the interface and thus Hf—Ta or Hf—C binding is formed.

According to the above facts, the reactivity of the Ta-rich composition $Ta_xC_{1-x}$ electrode layer of the present invention is higher than that of the conventional C-rich composition $Ta_xC_{1-x}$ electrode layer. For this reason, the electrode layer reacts with the gate dielectric, and mutual diffusion and recombination of the interfacial binding state occur near the interface, so that the electrically preferable interfacial property can be realized. Embodiments of the CMIS semiconductor device constituted based on the above knowledge are described below.

First Embodiment

The CMIS semiconductor device according to a first embodiment has the same structure as that in FIG. 1 used for describing the common concept of the present invention. For this reason, FIG. 1 is used for the first embodiment, and the description about the portions already described is omitted. The gate electrodes 6 and 16 in the CMIS semiconductor device according to the first embodiment are formed from a single layer of the Ta-rich composition $Ta_xC_{1-x}$ electrode layer (x>0.5).

The Ta-rich composition $Ta_xC_{1-x}$ electrode layers 6 and 16 have an NaCl-prototype polycrystalline structure, and x is larger than 0.5. A crystal orientation ratio of a TaC (200) face to a TaC (111) face in the normal direction to the interfaces, [TaC (200) face/{TaC (200) face+TaC (111) face}], is larger than 50%. The layer thickness of the electrode layer is 0.5 nm or more and 50 nm or less, but preferably 2 to 50 nm after the single layer is taken into consideration. HfSiON is used for the gate dielectrics 5 and 15.

According to the first embodiment, a semiconductor device, which has a simple single metal gate structure and high inversion layer carrier mobility suitable for a silicon CMOS device, can be realized.

Second Embodiment

Figure 22:
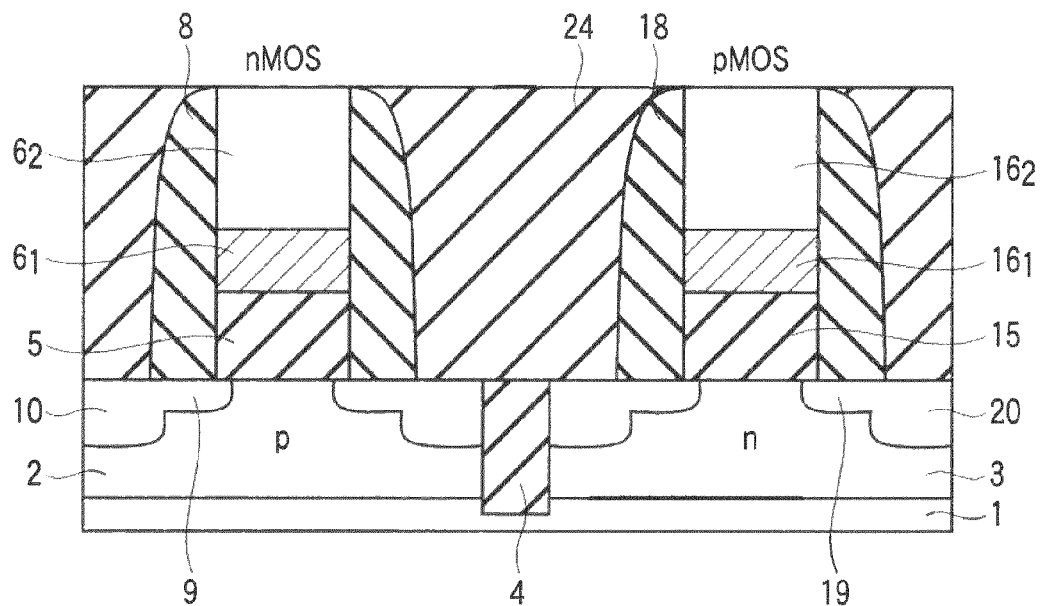
FIG. 22 is a cross-sectional view illustrating a CMIS semiconductor device according to a second embodiment.

FIG. 22 is a cross-sectional view illustrating a CMIS semiconductor device according to a second embodiment. Common portions in FIGS. 22 and 1 are denoted by common numbers, and an overlapped description is omitted. The CMIS semiconductor device according to the second embodiment has a stacked gate electrode structure, including Ta-rich $Ta_xC_{1-x}$ electrode layers $6_1$ and $16_1$ and polysilicon electrodes $6_2$ and $16_2$ formed on the Ta-rich $Ta_xC_{1-x}$ electrode layers $6_1$ and $16_1$. The polysilicon electrode is a material used in conventional MOS semiconductor devices, and has excellent compatibility with conventional semiconductor process.

The $Ta_xC_{1-x}$ electrode layers $6_1$ and $16_1$ in the second embodiment has an NaCl-prototype polycrystalline structure, and x is larger than 0.5. A crystal orientation ratio of a TaC (200) face to a TaC (111) face in the normal direction to the interfaces, [TaC (200) face/{TaC (200) face+TaC (111) face}], is larger than 50%. The layer thickness of the TaC electrode layer is 0.5 nm or more and 10 nm or less, and the layer thickness of the polysilicon layer $6_2$ and $16_2$ is 50 nm, for example. HfSiON is used as the gate dielectrics 5 and 15.

According to the second embodiment, a CMIS semiconductor device having a single metal gate structure and high inversion layer carrier mobility suitable for conventional processing can be realized.

Third Embodiment

Figure 23:
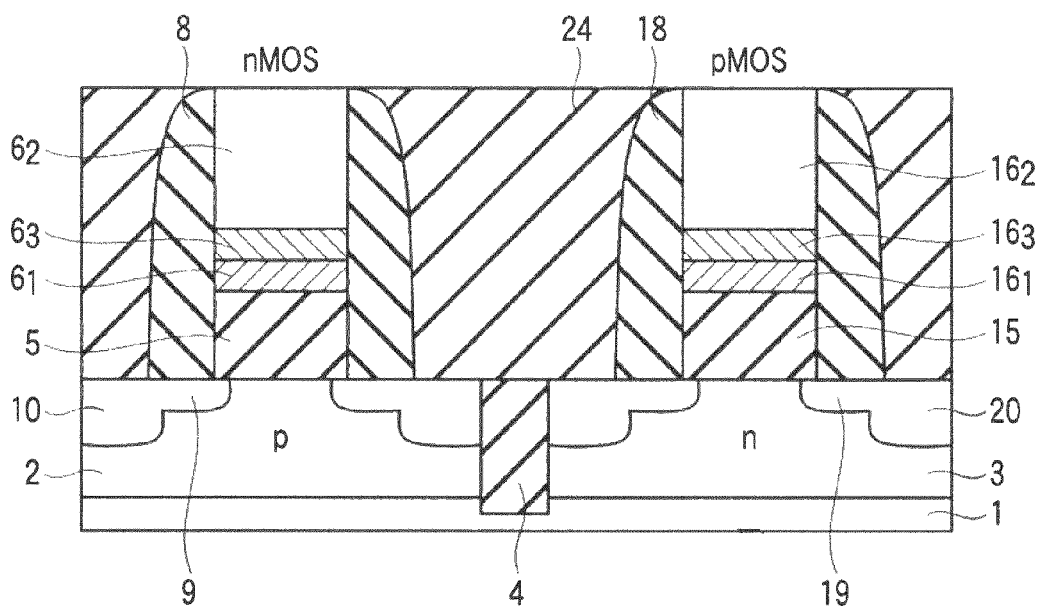
FIG. 23 is a cross-sectional view illustrating a CMIS semiconductor device according to a third embodiment.

FIG. 23 is a pattern cross-sectional view illustrating the CMIS semiconductor device according to a third embodiment of the present invention. The semiconductor device according to the third embodiment has a stacked electrode structure including three layers of the Ta-rich composition $Ta_xC_{1-x}$ electrode layers (x>0.5) $6_1$ and $16_1$, the heat-resistant metal layers $6_3$ and $16_3$ and the poly Si layers $6_2$ and $16_2$ as the gate electrodes of both the p-channel MIS transistor and the n-channel MIS transistor.

As one example of a practical metal gate technique, a so-called metal inserted poly Si structure (MIPS) is very promise. This is a structure where a thin metal electrode layer is inserted between the gate dielectric and the conventional poly Si gate electrode. The thin metal electrode layer may be a single layer or a multi-layer. The manufacturing steps of the MIPS structure is similar to those of the conventional polycrystalline gate technique in many respects, and affinity and compatibility are high. A polysilicon layer whose resistance is sufficiently low can be used, and dry etching for the gate becomes easy. For this reason, it is desirable to combine the Ta-rich composition $Ta_xC_{1-x}$ electrode layer (x>0.5) with the MIPS technique.

In the combination of the Ta-rich composition $Ta_xC_{1-x}$ electrode layer and the MIPS technique, the following technical artifice for a composition x of the $Ta_xC_{1-x}$ electrode layer and a design value of the layer thickness d is effective.

The Ta-rich composition $Ta_xC_{1-x}$ electrode layer has higher reactivity than that of the conventional C-rich composition $Ta_xC_{1-x}$ electrode layer, and it occasionally reacts with not only the gate dielectric but also the polysilicon layer on the upper portion. In this case, the desired reactivity of the Ta-rich composition $Ta_xC_{1-x}$ electrode layer is changed, and thus the effect of the present invention might not be produced or the controllability might be deteriorated. In order to provide the effect of the present invention, the Ta-rich composition $Ta_xC_{1-x}$ electrode layer of 2 nm or less may be used. However, when the layer thickness of the Ta-rich composition $Ta_xC_{1-x}$ electrode layer is particularly thin, the likelihood of these problems occurring increases.

If the reaction with the upper polysilicon is taken into consideration in advance, the composition x and the layer thickness d of the Ta-rich composition $Ta_xC_{1-x}$ electrode layer are designed so that even if the electrode layer reacts with the upper polysilicon, a desirable reaction with the lower gate dielectric on the interface is caused. As a result, a single-layered Ta-rich composition $Ta_xC_{1-x}$ electrode layer is effectively combined with the MIPS technique.

In order to eradicate concerns as regards excellent controllability, it is effective to insert a low reactive heat-resistant metal layer between the Ta-rich composition $Ta_xC_{1-x}$ electrode layer of the present invention and the polysilicon layer. As the heat-resistant metal layer, carbide and nitride of a high-melting-point metal such as titanium, molybdenum, tungsten and tantalum are effective. Examples of such carbide and nitride are C-rich composition $Ta_xC_{1-x}$ layer, a TiN layer, an $HfC_x$ layer, a WN layer, and a TaN layer, or a stacked layer of these. Particularly, a C-rich composition $Ta_xC_{1-x}$ layer and TiN layer are effective.

The reason why the C-rich composition $Ta_xC_{1-x}$ layer is effective is that since it is composed of the same element systems as that of the Ta-rich composition $Ta_xC_{1-x}$ electrode layer, the reactive dry etching steps at the time of pattering the gate electrode layer can be simplified. A stacked layer of Ta-rich composition $Ta_xC_{1-x}$ layer/C-rich composition $Ta_xC_{1-x}$ electrode layer/TiN layer/polysilicon layer corresponds to the specimen #4, and its mobility and gate leakage current (Jg) which are more excellent than those in the conventional C-rich electrode technique are verified.

The reason why the TiN layer is effective is that since TiN is already used in current semiconductor manufacturing steps, the difficulty in performing the reactive dry etching is low. The reactive dry etching of the $Ta_xC_{1-x}$ layer is comparatively difficult due to the high chemical stability of $Ta_xC_{1-x}$. In the dry etching of a metal electrode layer, generation of a tapered shape, and generation of an undercut (notch) shape often create fabrication problems. In order to easily avoid such problems, the layer thickness of the Ta-rich composition $Ta_xC_{1-x}$ electrode layer is designed to be comparatively thin, and TiN is used as the heat-resistant metal layer. As a result, the TiN layer is easily dry-etched, and since the Ta-rich composition $Ta_xC_{1-x}$ layer is thin, the dry etching becomes easy. The stacked layer of Ta-rich composition $Ta_xC_{1-x}$ layer/TiN layer/polysilicon layer actually corresponds to #1 to #3, and its mobility and gate leakage current (Jg) which are more excellent than those in the conventional C-rich electrode technique are verified.

A method for manufacturing the semiconductor device according to the third embodiment is described below. The first and second embodiments do not describe the manufacturing method, but since the third embodiment includes the same steps, the description about this in the third embodiment is applied also to the first and second embodiments.

The device isolating layer 4 is formed on a main surface of the semiconductor substrate (1, 2, 3). The substrate may be a silicon substrate, an SOI substrate, a germanium substrate, a silicon substrate on which a germanium layer is formed, or a silicon substrate on which germanium layers with an intermediate layer of silicon germanium interposed therebetween are formed. Methods that can be used for forming the device isolating layer 4 are local oxidizing and shallow trench isolation (STI), and a shape of the device isolating layer 4 may be a mesa shape.

After the device isolating layer 4 is formed, the p-type well 2 and the n-type well 3 are formed. An SiGe layer or an SiGe layer having a cap layer of Si is formed on the n-type well 3, thus pMIS may have a SiGe channel at the final stage. Nitrogen ions may be implanted into the p-type well 2. Fluorine ions may be implanted into the n-type well 3.

The gate dielectrics 5 and 15 are formed on upper surfaces of the p-type well 2 and the n-type well 3, respectively. Before the gate dielectrics are formed, $SiO_2$ or SiON may be formed as an interfacial layer between the gate dielectrics and the channels. Methods for forming the interfacial layer include thermal oxidation, plasma thermal oxidation, ozone water treatment, chemical oxidation, plasma nitriding or ammonia thermal treatment, or combinations thereof.

Before the gate dielectrics are formed, a thin film of La, Ce, Pr, Tb, Dy, Er, Yb, Y, Mg, Sr or Ba, or oxides thereof may be formed on the interfacial layer of nMIS. Before the gate dielectrics are formed, a thin film of Al or Al oxide may be formed on the interfacial layer of pMIS.

As to a method for forming the gate dielectrics 5 and 15, a high-dielectric constant film, which is composed of an oxide of a metal element selected from Hf and Zr, silicate of a metal element selected from Hf and Zr, or zirconate of Hf, may be deposited by a chemical vapor deposition (CVD) method or an atomic layer deposition (ALD) method. After the gate dielectrics are formed, the gate dielectrics may be plasma-nitrided. An La—Hf—O film or an La—Al—O film may be formed by a laser ablation method or the ALD method.

After the gate dielectrics are formed, a thin film of La, Ce, Pr, Tb, Dy, Er, Yb, Y, Mg, Sr or Ba, or their oxide may be formed on the gate dielectric of nMIS. Further, after the gate dielectrics are formed, a thin film of Al or Al oxide may be formed on the gate dielectrics of pMIS.

Thereafter, a conductive film having a single layer or a multi-layer to be a gate electrode 6 ($6_1$, $6_2$, $6_3$), 16 ($16_1$, $16_2$, $16_3$) is formed on the upper surfaces of the gate dielectrics 5 and 15 by a known method. The Ta-rich composition $Ta_xC_{1-x}$ electrode layer is formed by the sputtering method or the CVD method. After the Ta-rich composition $Ta_xC_{1-x}$ electrode layer is formed, the C-rich composition $Ta_xC_{1-x}$ electrode layer may be formed sequentially. Titanium nitride may be formed on the upper portion of the Ta-rich composition $Ta_xC_{1-x}$ electrode layer by a physical vapor deposition (PVD) method. Thereafter, a polycrystalline silicon layer of 50 nm is deposited on the upper surface by a low pressure CVD method.

Patterning is carried out by a photolithography technique. The gate electrodes 6 and 16 are shaped by anisotropic etching. The extensions 9 and 19 with high-impurity concentration of the n-type and p-type MIS transistors are formed by implanting phosphorus ions and boron ions, respectively. In the formation of the extensions 9 and 19, a selective epitaxial growth method may be used, and an elevated source and drain structure which can repress a short channel effect may be used. When the elevated source and drain structure is formed, impurities may be simultaneously introduced.

Sidewall dielectrics 8 and 18 for insulating the gate electrode and the source/drain regions are formed. Phosphorus ions and boron ions are implanted by an acceleration voltage higher than that at the time of forming the extension, so that deep diffusion regions (deep regions) 10 and 20 are formed. Thereafter, spike anneal at about 1000° C. is carried out in order to activate impurities. As the activating method, flash lamp anneal, laser anneal or the like can be used.

A silicon oxide film to be an interlayer dielectric 24 is deposited by the low pressure CVD, and upper ends of the gate electrodes 6 and 16 are exposed by chemical mechanical planarization (CMP).

A nickel layer of 10 nm, not shown, is deposited on upper surfaces of the polysilicon gate electrodes $6_3$ and $16_3$ by the sputtering method as the need arises. A low-temperature heat treatment at 500° C. is performed so that silicide is formed between the nickel layer and the polysilicon layer starting from the interfacial region thereof, and $Ni_2Si$ is formed. Unreacted Ni is removed by using a mixed solution of sulfuric acid and hydrogen peroxide solution.

In the third embodiment, only a part of polycrystalline silicon is silicided, but the film thickness of Ni is thickened so that the entire polycrystalline silicon may be converted into silicide. In this case, impurity doping to the gate polysilicon for reducing resistance, which is carried out simultaneously with the ion implanting into normal source and drain, is not necessary. Concerns regarding the possibility of impurities being diffused to the substrate from the gate polysilicon via the dielectric can be completely avoided. This is only problematic when the layer thickness of the metal gate layer is thin.

A CMISFET semiconductor device having a structure shown in FIG. 23 is manufactured by the above manufacturing method. The semiconductor device in the third embodiment has a single gate structure using the same gate electrode for the pMIS and nMIS transistors. For this reason, it is not necessary to fabricate a gate electrode separately. Therefore, the step is simple, and damage to the dielectric surface and a change in quality at the time of separate fabrication can be completely avoided.

The third embodiment produces a similar effect to the first and second embodiments, and the CMIS semiconductor device with gates easily formable can be provided.

Fourth Embodiment

Figure 24:
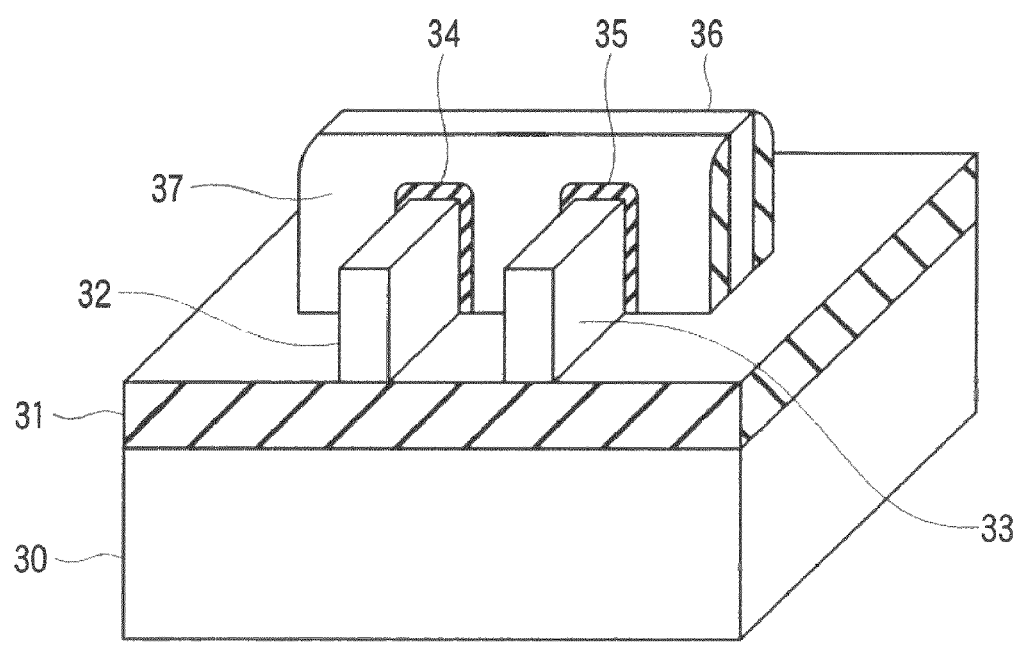
FIG. 24 is a perspective view illustrating a CMIS semiconductor device according to a fourth embodiment.

FIG. 24 is a perspective view illustrating a schematic structure of the CMIS semiconductor device according to a fourth embodiment. The fourth embodiment concerns a so-called FinFET, in which p-type and n-type FETs are protruded from a substrate surface.

An embedded dielectric 31 of $SiO_2$ is formed on the Si substrate (semiconductor substrate) 30. A Fin p-type Si layer (first semiconductor region) 32 and a Fin n-type SiGe layer (second semiconductor region) 33 are formed parallel on the dielectric 31. A gate dielectric 34 composed of an HfSiON film to which La is added is formed on a the upper surface and the side surfaces of the Fin p-type Si layer 32. A gate dielectric 35 composed of an HfSiON film to which Al is added is formed on the upper surface and the side surfaces of the Fin n-type SiGe layer 33.

A common gate electrode 36 composed of polysilicon/Ta-rich composition $Ta_xC_{1-x}$ stacked film is formed so as to cover the gate dielectrics 34 and 35. A gate sidewall dielectric 37 is formed on a side surface of the gate electrode 36.

The fourth embodiment describes the case of the two-layer stacked electrode of polysilicon/Ta-rich composition $Ta_xC_{1-x}$, but as described in the third embodiment, a three-layer stacked electrode of polysilicon/heat-resistant metal layer/Ta-rich composition $Ta_xC_{1-x}$ may be applied. In FIG. 24, for convenience, one transistor has one Fin semiconductor layer, but one transistor may have a plurality of Fin semiconductor layers.

According to the fourth embodiment, in addition to a similar effect produced in the first to third embodiments, an effect specific to FinFET can also be provided.

As described above, according to the embodiments of the present invention, there can be provided a semiconductor device which has a single metal gate structure suitable for a silicon CMIS device and can maintain a high inversion layer carrier mobility.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a p-channel MIS transistor formed on the semiconductor substrate, the p-channel MIS transistor having a first gate dielectric formed on the semiconductor substrate, a first gate electrode layer formed on the first gate dielectric and including Ta and C, and a first polysilicon layer formed on the first gate electrode layer; and
an n-channel MIS transistor formed on the semiconductor substrate, the n-channel MIS transistor having a second gate dielectric formed on the semiconductor substrate, a second gate electrode layer formed on the second gate dielectric and having the same composition and orientation as those of the first gate electrode, and a second polysilicon layer formed on the second gate electrode layer, wherein a mole ratio of Ta to a total of C and Ta, (Ta/(Ta +C)), is larger than 0.5 in the first gate electrode layer and the second gate electrode layer, and each of the first gate electrode layer and the second gate electrode layer has an NaCl-prototype polycrystalline structure.

2. The semiconductor device according to claim 1, wherein each of the first gate electrode layer and the second gate electrode layer has a film thickness of 0.5 nm or more and 10 nm or less.

3. The semiconductor device according to claim 1, wherein the first gate dielectric and the second gate dielectric include Hf and Si.

4. The semiconductor device according to claim 1, wherein the first gate dielectric includes Al, and the second gate dielectric includes one element selected from the group consisting of La, Ce, Pr, Tb, Dy, Er, Yb, Y, Mg, Sr and Ba.

5. A semiconductor device comprising:
a semiconductor substrate;
a p-channel MIS transistor formed on the semiconductor substrate, the p-channel MIS transistor having a first gate dielectric formed on the semiconductor substrate, a first gate electrode layer formed on the first gate dielectric and including Ta and C, and a first polysilicon layer formed on the first gate electrode layer; and
an n-channel MIS transistor formed on the semiconductor substrate, the n-channel MIS transistor having a second gate dielectric formed on the semiconductor substrate, a second gate electrode layer formed on the second gate dielectric and having the same composition and orientation as those of the first gate electrode, and a second polysilicon layer formed on the second gate electrode layer, wherein a mole ratio of Ta to a total of C and Ta, (Ta/(Ta +C)), is larger than 0.5 in the first gate electrode layer and the second gate electrode layer, and at an interface between the first gate electrode layer and the first gate dielectric, and at an interface between the second gate electrode layer and the second gate dielectric, a crystal orientation ratio of a TaC (200) face to a TaC (111) face in the normal direction to the interfaces, [TaC (200) face/{TaC (200) surface +TaC (111) surface}], is larger than 0.5.

6. The semiconductor device according to claim 5, wherein each of the first gate electrode layer and the second gate electrode layer has a film thickness of 0.5 nm or more and 10 nm or less.

7. The semiconductor device according to claim 5, wherein the first gate dielectric and the second gate dielectric include Hf and Si.

8. The semiconductor device according to claim 5, wherein the first gate dielectric includes Al, and the second gate dielectric includes one element selected from the group consisting of La, Ce, Pr, Tb, Dy, Er, Yb, Y, Mg, Sr and Ba.

* * * * *